US008803773B2

(12) United States Patent
Ozawa

(10) Patent No.: US 8,803,773 B2
(45) Date of Patent: Aug. 12, 2014

(54) DISPLAY APPARATUS

(75) Inventor: Tokuroh Ozawa, Suwa (JP)

(73) Assignee: Intellectual Keystone Technology LLC, Wilmington, DE (US)

( * ) Notice: Subject to any disclaimer, the term of this patent is extended or adjusted under 35 U.S.C. 154(b) by 1136 days.

(21) Appl. No.: 10/367,849

(22) Filed: Feb. 19, 2003

(65) Prior Publication Data

US 2003/0151568 A1    Aug. 14, 2003

Related U.S. Application Data

(63) Continuation of application No. 09/242,904, filed as application No. PCT/JP98/02982 on Jul. 1, 1998, now Pat. No. 6,618,029.

(30) Foreign Application Priority Data

Jul. 2, 1997    (JP) ........................................ 9-177455

(51) Int. Cl.
*G09G 3/32* (2006.01)
*G09G 3/06* (2006.01)
*G09G 3/14* (2006.01)
*H01L 29/04* (2006.01)
*H01L 29/40* (2006.01)
*H01L 29/10* (2006.01)
*H01L 31/036* (2006.01)
*H01J 1/62* (2006.01)
*H01J 63/04* (2006.01)

(52) U.S. Cl.
USPC ................... 345/82; 345/44; 345/46; 257/40; 257/59; 313/505

(58) Field of Classification Search
USPC ............... 345/70–83, 204–206, 96, 209, 698; 315/169.1, 169.3; 257/40, 59, 72; 349/44–48
See application file for complete search history.

(56) References Cited

U.S. PATENT DOCUMENTS 4,006,383 A      2/1977 Luo et al.
4,087,792 A *   5/1978 Asars .............................. 345/77

(Continued)

FOREIGN PATENT DOCUMENTS

EP           0448727 A1    10/1991
EP         0 717 446 A2     6/1996

(Continued)

OTHER PUBLICATIONS

Johannes Adam, New Correlations Between Electrical Current and Temperature Rise in PCB Traces, 20th IEEE Semi-Therm Symposium, 2004, available at http:www.flomerics.com/flotherm/technical_papers/t341.pds.*

(Continued)

*Primary Examiner* — Amare Menistu
*Assistant Examiner* — Crystal A Mathews
(74) *Attorney, Agent, or Firm* — Sughrue Mion, PLLC

(57) ABSTRACT

A display apparatus is provided which is capable of improving display quality by expanding the light-emission area of pixels by improving the layout of pixels and common power-feed lines formed on a substrate. Pixels including a light-emission element, such as an electroluminescence element or an LED element, are arranged on both sides of common power-feed lines so that the number of common power-feed lines is reduced. Further, the polarity of a driving current flowing between the pixels and the light-emission element is inverted so that the amount of current flowing through the common power-supply lines is reduced.

9 Claims, 22 Drawing Sheets

(56) References Cited

U.S. PATENT DOCUMENTS

| | | | |
|---|---|---|---|
| 4,135,959 A | 1/1979 | Luo et al. | |
| 4,636,038 A | 1/1987 | Kitahara et al. | |
| 4,738,514 A | 4/1988 | Stewart | |
| 4,820,222 A * | 4/1989 | Holmberg et al. | 445/3 |
| 5,014,104 A | 5/1991 | Ema | |
| 5,071,055 A | 12/1991 | Grauleau et al. | |
| 5,177,406 A | 1/1993 | Troxell | |
| 5,264,758 A | 11/1993 | Iijima et al. | |
| 5,299,157 A | 3/1994 | Kimura et al. | |
| 5,302,966 A | 4/1994 | Stewart | |
| 5,317,432 A | 5/1994 | Ino | |
| 5,377,031 A | 12/1994 | Vu et al. | |
| 5,414,547 A | 5/1995 | Matsuo | |
| 5,479,068 A | 12/1995 | Muto | |
| 5,500,750 A | 3/1996 | Kanbe | |
| 5,506,375 A | 4/1996 | Kikuchi | |
| 5,525,867 A | 6/1996 | Williams | |
| 5,550,066 A | 8/1996 | Tang et al. | 438/29 |
| 5,587,329 A | 12/1996 | Hseuh et al. | 437/40 |
| 5,627,557 A | 5/1997 | Yamaguchi et al. | |
| 5,631,753 A | 5/1997 | Hamaguchi et al. | |
| 5,640,067 A | 6/1997 | Yamauchi et al. | |
| 5,641,974 A | 6/1997 | den Boer et al. | |
| 5,670,792 A * | 9/1997 | Utsugi et al. | 257/59 |
| 5,670,994 A * | 9/1997 | Kawaguchi et al. | 345/206 |
| 5,684,365 A | 11/1997 | Tang et al. | 315/169.3 |
| 5,689,279 A * | 11/1997 | Nelson et al. | 345/82 |
| 5,701,055 A | 12/1997 | Nagayama et al. | |
| 5,726,678 A | 3/1998 | Dingwall | |
| 5,742,129 A | 4/1998 | Nagayama et al. | 315/167 |
| 5,748,165 A * | 5/1998 | Kubota et al. | 345/96 |
| 5,801,673 A | 9/1998 | Shimada et al. | |
| 5,804,917 A | 9/1998 | Takahashi et al. | |
| 5,808,595 A | 9/1998 | Kubota et al. | |
| 5,812,188 A | 9/1998 | Adair | |
| 5,828,428 A | 10/1998 | Kim et al. | |
| 5,828,429 A * | 10/1998 | Takemura | 349/42 |
| 5,854,616 A * | 12/1998 | Ota et al. | 345/100 |
| 5,877,830 A | 3/1999 | Shimada et al. | |
| 5,903,246 A * | 5/1999 | Dingwall | 345/82 |
| 5,907,313 A | 5/1999 | Kubota et al. | |
| 5,909,081 A | 6/1999 | Eida et al. | 313/504 |
| 5,973,449 A | 10/1999 | Nakamura et al. | |
| 5,977,562 A | 11/1999 | Hirakata et al. | |
| 5,986,723 A | 11/1999 | Nakamura et al. | |
| 5,989,945 A | 11/1999 | Yudasaka et al. | |
| 6,002,463 A | 12/1999 | Fujikawa | |
| 6,022,766 A | 2/2000 | Chen et al. | |
| 6,038,004 A | 3/2000 | Nannon et al. | |
| 6,055,034 A | 4/2000 | Zhang et al. | |
| 6,057,647 A | 5/2000 | Kurosawa et al. | |
| 6,060,333 A | 5/2000 | Tanaka et al. | |
| 6,072,450 A | 6/2000 | Yamada et al. | 345/76 |
| 6,114,715 A | 9/2000 | Hamada | |
| 6,115,014 A | 9/2000 | Aoki et al. | |
| 6,123,876 A | 9/2000 | Kobayashi et al. | 252/519.2 |
| 6,133,163 A | 10/2000 | Tanaka et al. | |
| 6,137,552 A | 10/2000 | Yanai | |
| 6,147,451 A | 11/2000 | Shibata et al. | |
| 6,150,668 A | 11/2000 | Bao et al. | |
| 6,160,272 A | 12/2000 | Arai et al. | 257/72 |
| 6,175,186 B1 | 1/2001 | Matsuura et al. | |
| 6,175,395 B1 | 1/2001 | Yamazaki et al. | |
| 6,188,112 B1 * | 2/2001 | Bryant | 257/379 |
| 6,194,837 B1 | 2/2001 | Ozawa | |
| 6,229,508 B1 * | 5/2001 | Kane | 345/82 |
| 6,284,072 B1 | 9/2001 | Ryan et al. | |
| 6,295,043 B1 * | 9/2001 | Hashimoto et al. | 345/96 |
| 6,359,606 B1 | 3/2002 | Yudasaka | |
| 6,373,453 B1 | 4/2002 | Yudasaka | |
| 6,380,672 B1 * | 4/2002 | Yudasaka | 313/504 |
| 6,462,722 B1 | 10/2002 | Kimura et al. | |
| 6,522,315 B2 * | 2/2003 | Ozawa et al. | 345/92 |
| 6,542,137 B2 | 4/2003 | Kimura | |
| 6,545,424 B2 | 4/2003 | Ozawa | |
| 6,618,023 B2 | 9/2003 | Park | |
| 6,618,029 B1 * | 9/2003 | Ozawa | 345/82 |
| 6,630,784 B2 | 10/2003 | Yoneda | |
| 7,012,367 B2 | 3/2006 | Seki | |
| 2002/0024493 A1 | 2/2002 | Ozawa et al. | 345/92 |
| 2003/0151568 A1 | 8/2003 | Ozawa | |
| 2003/0193493 A1 | 10/2003 | Ozawa | |
| 2008/0036699 A1 | 2/2008 | Yudasaka | |
| 2008/0158209 A1 | 7/2008 | Ozawa | |
| 2008/0165174 A1 | 7/2008 | Ozawa | |
| 2008/0180421 A1 | 7/2008 | Yudasaka | |
| 2008/0198152 A1 | 8/2008 | Ozawa | |
| 2009/0303165 A1 | 12/2009 | Yudasaka | |
| 2010/0045577 A1 | 2/2010 | Yudasaka | |

FOREIGN PATENT DOCUMENTS

| | | |
|---|---|---|
| EP | 0 862 156 A1 | 9/1998 |
| EP | 0880303 A1 | 11/1998 |
| EP | 0 895 219 A | 2/1999 |
| EP | 1365276 A2 | 11/2003 |
| JP | 52064891 | 5/1977 |
| JP | A 59-58468 | 4/1984 |
| JP | 6017479 A | 1/1985 |
| JP | A 01-186655 | 7/1989 |
| JP | 02066867 A | 3/1990 |
| JP | A-4-70820 | 3/1992 |
| JP | 06325869 A | 11/1994 |
| JP | 07057871 A | 3/1995 |
| JP | A 07-153576 | 6/1995 |
| JP | 07-181927 | 7/1995 |
| JP | A 07-235378 | 9/1995 |
| JP | A 07-283378 | 10/1995 |
| JP | 08-202287 | 8/1996 |
| JP | 08-227276 | 9/1996 |
| JP | A 08-241048 | 9/1996 |
| JP | 09081053 A | 3/1997 |
| JP | 09082476 A | 3/1997 |
| JP | 09161970 A | 6/1997 |
| JP | 09230311 A | 9/1997 |
| JP | A-10-222097 | 8/1998 |
| JP | 11-024604 | 1/1999 |
| JP | A 11-003048 | 1/1999 |
| JP | 11-065487 | 3/1999 |
| JP | A 2004-046210 | 2/2004 |
| KR | 93004994 B1 | 5/1991 |
| WO | 95/09381 A1 | 4/1995 |
| WO | WO 98/03699 | 1/1998 |
| WO | WO 98/12689 | 3/1998 |

OTHER PUBLICATIONS

Web-based document PCB Trace, HardwareBook (HwB), at www.hardwarebook.info/PCB_trace (providing data tables for circuit board trace width).*

"Development of a Thin Film Transistor Circuit for a Luminescent Type Flat Panel Display", Makoto Ichihara and Kiyoshi Matsuda, *Mitsubishi Kasei R&D Review*, 1993, vol. 7, No. 2, pp. 79-82.

Extended European Search Report dated Dec. 29, 2010, issued in European Patent Application No. 0 9166341.9.

European Search Report dated Jun. 23, 2005 issued in European Patent Application No. 04078120.5-1235.

European Search Report dated Jun. 23, 2005 issued in European Patent Application No. 04078130.4-1235.

Office Action dated Sep. 30, 2003 issued in Japanese Patent Application No. 1997-177455.

Office Action dated Aug. 16, 2011 issued in U.S. Appl. No. 12/073,341.

Office Action dated Mar. 15, 2011 issued in U.S. Appl. No. 12/073,258.

Office Action dated Apr. 12, 2011 issued in U.S. Appl. No. 12/073,440.

Office Action dated Apr. 13, 2011 issued in U.S. Appl. No. 12/073,341.

European Search Report dated Jan. 7, 2011 issued in EP Appl. No. 09166341.9.

(56) References Cited

OTHER PUBLICATIONS

Office Action dated Dec. 15, 2003 issued in U.S. Appl. No. 10/367,849.
Office Action dated Apr. 21, 2004 issued in U.S. Appl. No. 10/367,849.
Office Action dated May 17, 2004 issued in U.S. Appl. No. 10/367,849.
Office Action dated Jan. 22, 2008 in U.S. Appl. No. 10/367,849.
Office Action dated Jan. 23, 2009 issued in U.S. Appl. No. 10/367,849.
Office Action dated Nov. 10, 2009 issued in U.S. Appl. No. 10/367,849.
Office Action dated May 20, 2010 issued in U.S. Appl. No. 10/367,849.
Declaration under 37 CFR 1.132 by Ichio Yudasaka dated Jul. 28, 2006.
Office Action dated Jul. 27, 2011 issued in U.S. Appl. No. 12/073,258.
Office Action dated Mar. 25, 2011 issued in U.S. Appl. No. 11/905,591.
Office Action dated Oct. 26, 2010 issued in U.S. Appl. No. 11/905,591.
The American Heritage Dictionary of the English Language, Fourth Edition, Copyright 2000 by Houghton Mifflin Company, Published by the Houghton Mifflin Company, www.bartleby.com/65/56U0085600.html, Definition of "unitary".

* cited by examiner

SECTION E-E'

US 8,803,773 B2

DISPLAY APPARATUS

This is a Continuation of application Ser. No. 09/242,904 filed Feb. 25, 1999, which in turn is a National Stage of PCT/JP98/02982 filed Jul. 1, 1998. The entire disclosure of the prior application is hereby incorporated by reference herein in its entirety.

BACKGROUND OF THE INVENTION

1. Field of the Invention

The present invention relates to an active-matrix-type display apparatus which uses light-emission elements, such as EL (electroluminescence) elements that emit light when driving current flows through an organic semiconductor film or LED (light-emitting diode) elements, and thin-film transistors (hereinafter referred to as "TFTs") that control the light-emission operation of this light-emission element. More particularly, the present invention relates to layout optimization technology for improving the display characteristics thereof.

2. Description of Related Art

Active-matrix-type display apparatuses which use current-control-type light-emission elements, such as EL elements or LED elements, have been proposed. Since any of the light-emission elements used in this type of display apparatus may emit light by itself, unlike a liquid-crystal display device, a backlight is not required, and there are advantages in that viewing angle dependence is small.

FIG. 22 shows, as an example of such a display apparatus, a block diagram of an active-matrix-type display apparatus which uses charge-injection-type organic thin-film EL elements. In a display apparatus 1A shown in this figure, formed on a transparent substrate are a plurality of scanning lines "gate", a plurality of data lines "sig" extending in a direction intersecting the extension direction of these scanning lines "gate", a plurality of common power-feed lines "com" which are parallel to these data lines "sig", and pixels 7 corresponding to the intersections of the data lines "sig" and the scanning lines "gate". With respect to the data lines "sig", a data-side driving circuit 3 comprising a shift register, a level shifter, video in, and an analog switch is formed. With respect to the scanning lines, a scanning-side driving circuit 4 comprising a shift register and a level shifter is formed. Further, each of the pixels 7 is formed with a first TFT 20 in which a scanning signal is supplied to its gate electrode via the scanning lines, a holding capacitor "cap" for holding an image signal supplied from the data lines "sig" via this first TFT 20, a second TFT 30 in which an image signal held by this holding capacitor "cap" is supplied to its gate electrode, and light-emission elements 40 to which driving current flows from the common power-feed lines "com" when these are electrically connected to the common power-feed lines "com" via the second; TFT 30.

Specifically, as shown in FIGS. 23(A) and 23(B), in all the pixels 7, the first TFT 20 and the second TFT 30 are formed using two island-shaped semiconductor films, a relay electrode 35 is electrically connected to the source and drain regions of the second TFT 30 via a contact hole of a first interlayer insulation film 51, and a pixel electrode 41 is electrically connected to the relay electrode 35 via a contact hole of a second interlayer insulation film 52. On the side of the upper layers of this pixel electrode 41, a positive-hole injection layer 42, an organic semiconductor film 43, and a counter electrode "op" are multilayered. Here, the counter electrode "op" is formed over a plurality of pixels 7 in such a manner as to extend across the data lines "sig" and the like. Further, the common power-feed lines "com" are electrically connected to the source and drain regions of the second TFT 30 via the contact hole.

In contrast, in the first TFT 20, a potential holding electrode "st" which is electrically connected to the source and drain regions is electrically connected to an extended portion 310 of a gate electrode 31. On the side of the lower layers thereof, a semiconductor film 400 opposes this extended portion 310 via a gate insulation film 50, and since this semiconductor film 400 is made to conduct by impurities introduced thereinto, this semiconductor film 400, together with the extended portion 310 and the gate insulation film 50, constitute the holding capacitor "cap". Here, the common power-feed line "com" is electrically connected to the semiconductor film 400 via the contact hole of the first interlayer insulation film 51. Therefore, since the holding capacitor "cap" holds an image signal supplied from the data lines "sig" via the first TFT 20, even if the first TFT 20 is turned off, the gate electrode 31 of the second TFT 30 is held at a potential corresponding to the image signal. Therefore, since the driving current continues to flow to the light-emission element 40 from the common power-feed lines "com", the light-emission element 40 continues to emit light.

However, in comparison with the liquid-crystal display apparatus, in the display apparatus 1A, there is a problem in that the display quality cannot be improved because the pixels 7 are narrower by an amount corresponding to the requirement of the second TFT 30 and the common power-feed lines "com".

SUMMARY OF THE INVENTION

Accordingly, an object of the present invention is to provide a display apparatus capable of improving display quality by expanding the light-emission area of pixels by improving the layout of pixels and common power-feed lines formed on a substrate.

In order to solve the above-described problems, the present invention provides a display apparatus comprising on a substrate: a plurality of scanning lines; a plurality of data lines extending in a direction intersecting the extension direction of the scanning lines; a plurality of common power-feed lines parallel to the data lines; and pixels formed in a matrix by the data lines and the scanning lines, each of the pixels comprising: a first thin-film transistor in which a scanning signal is supplied to its first gate electrode via the scanning lines; a holding capacitor for holding an image signal supplied from the data lines via the first thin-film transistor; a second thin-film transistor in which the image signal held by the holding capacitor is supplied to its second gate electrode; and a light-emission element having an organic semiconductor film, which emits light by driving current that flows between a pixel electrode and a counter electrode when the pixel electrode is electrically connected to the common power-feed line via the second thin-film transistor in a section between the layers of the pixel electrodes formed for each of the pixels and the counter electrodes opposing the pixel electrodes, wherein pixels in which the driving current is passed in a section between the pixels and the common power-feed lines are arranged on both sides of the common power-feed lines, and the data lines pass on a side opposite to the common power-feed lines with respect to the pixels.

Specifically, in the present invention, since a data line, a group of pixels connected thereto, one common power-feed line, a group of pixels connected thereto, and a data line for supplying a pixel signal to the group of pixels are assumed to be one unit and this is repeated in the extension direction of scanning lines, pixels for two rows are driven by one common power-feed line. Therefore, the formation area of common power-feed lines can be made more narrow than in a case in which a common power-feed line is formed for each group of pixels for one row, the light-emission area of the pixels can be expanded correspondingly. Therefore, it is possible to improve display performance, such as luminance, contrast ratio, and so on.

When the construction is formed in this manner, it is preferable that, for example, in a section between two pixels arranged in such a manner as to sandwich the common power-feed line, the first thin-film transistor, the second thin-film transistor, and the light-emission elements be disposed in linear symmetry about the common power-feed line.

In the present invention, also, it is preferable that the pitch of the centers of the formation areas of the organic semiconductor films be equal at every interval between adjacent pixels along the extension direction of the scanning lines. When the construction is formed in this manner, it is convenient to cause a material for an organic semiconductor film to be discharged from an ink-jet head and to form an organic semiconductor film. That is, since the pitch of the centers of the formation areas of the organic semiconductor films is equal, the material for an organic semiconductor film may be discharged from the ink-jet head at even intervals. This simplifies the movement control mechanism of the ink-jet head, and the position accuracy is improved.

Further, it is preferable that the formation area of the organic semiconductor film be surrounded by a bank layer formed from an insulation film thicker than the organic semiconductor film, and that the bank layer be formed in such a manner as to cover the data lines and the common power-feed line at the same width dimension. When the construction is formed in this manner, since the bank layer prevents the extrusion of the organic semiconductor film into its periphery when the organic semiconductor film is formed by an ink-jet method, the organic semiconductor film can be formed within a predetermined area. Further, since the bank layer covers the data lines and the common power-feed line at the same width dimension, this is suitable for making the pitch of the centers of the formation areas of the organic semiconductor films equal at any interval of the adjacent pixels along the extension direction of the scanning lines. Here, the counter electrodes are formed at least on nearly the entire surface on the pixel area or over a wide area in a stripe form, and are in a state of opposing the data lines. Therefore, if kept in this state, a large capacitance parasitizes the data lines. However, in the present invention, since a bank layer is interposed between the data lines and the counter electrodes, it is possible to prevent parasitization of the capacitance formed in a section adjoining the counter electrodes into the data lines. As a result, since the load in the data-side driving circuit can be reduced, power consumption can be reduced or a higher-speed display operation can be achieved.

In the present invention, it is preferable that a wiring layer be formed at a position corresponding to a section between two data lines passing on a side opposite to the common power-feed line with respect to the pixels. When two data lines are parallel to each other, there is a risk that crosstalk may occur between these data lines. However, in the present invention, since another wiring layer different from those passes between two data lines, the crosstalk can be prevented by merely maintaining such a wiring layer at a fixed potential at least within one horizontal scanning period of the image.

In this case, between two adjacent data lines of the plurality of data lines, it is preferable that sampling of an image signal be performed at the same timing. When the construction is formed in this manner, since potential variations during sampling occur simultaneously in a section between two data lines, it is possible to more reliably prevent an occurrence of crosstalk between these data lines.

In the present invention, it is preferable that nearly the same number of pixels of two types, in which the light-emission elements are driven by a driving current whose polarity is inverted, be among the plurality of pixels in which the driving current is passed in a section between the pixels and the common power-feed lines.

When the construction is formed in this manner, the driving current which flows from the common power-feed line to the pixels cancels the driving current which flows from the pixels to the common power-feed line, thereby a smaller amount of driving current which flows through the common power-feed line is required. Therefore, since the common power-feed lines can be made narrow correspondingly, it is possible to expand the display area with respect to the panel exterior. It is also possible to eliminate luminance variations which occur due to a difference between driving currents.

For example, the construction is formed in such a way that the polarity of the driving current in each pixel is the same in the extension direction of the data lines and that, in the extension direction of the scanning lines, the polarity of the driving current in each pixel is inverted for each pixel or every two pixels. The construction may also be formed in such a way that the polarity of the driving current in each pixel is the same in the extension direction of the scanning lines and that, in the extension direction of the data lines, the polarity of the driving current in each pixel is inverted for each pixel or every two pixels. Of these constructions, in the case of the construction in which the polarity of the driving current is inverted every two pixels, for the pixels through which driving current of the same polarity flows, a counter electrode can be used in common between adjacent pixels, making it possible to reduce the number of slits of the counter electrode. That is, polarity inversion can be realized without increasing the resistance value of the counter electrodes through which a large current flows.

Furthermore, the construction may be formed in such a way that the polarity of the driving current in each pixel is inverted for each pixel in both the extension direction of the scanning lines and the extension direction of the data lines.

DETAILED DESCRIPTION OF PREFERRED EMBODIMENTS

The embodiments of the present invention will be described below with reference to the drawings.

First Embodiment (Overall Construction of Active-Matrix Substrate)

Figure 1:
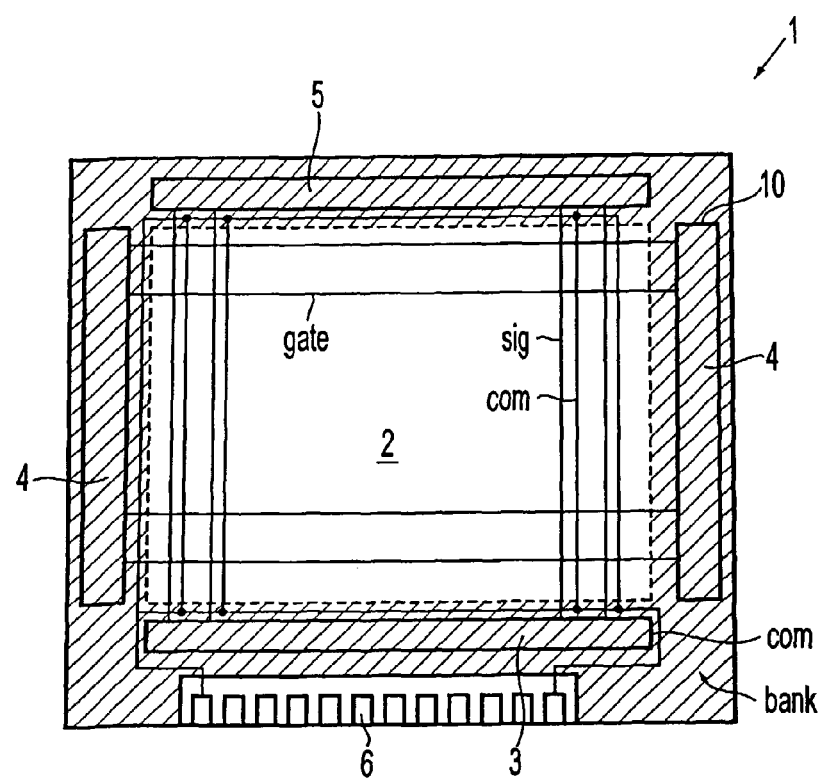
FIG. 1 is an illustration schematically showing a display apparatus of the present invention, and the formation area of a bank layer formed therein.
Figure 2:
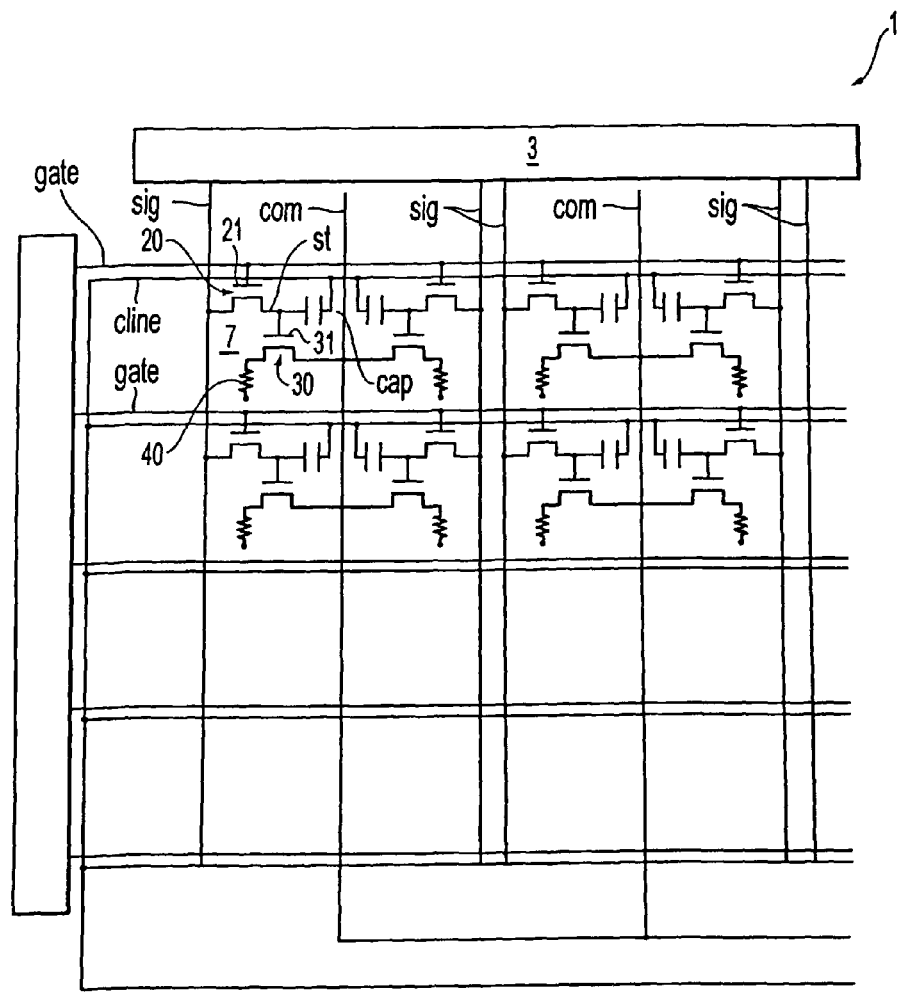
FIG. 2 is a block diagram showing the basic construction of the display apparatus of the present invention.

FIG. 1 is a block diagram schematically showing the overall layout of a display apparatus. FIG. 2 is an equivalent circuit diagram of an active matrix formed therein.

As shown in FIG. 1, in a display apparatus 1 of this embodiment, the central portion of a transparent substrate 10, which is a base body thereof, is formed into a display section 2. On both ends of the data lines "sig" of the peripheral portion of the transparent substrate 10, a data-side driving circuit 3 for outputting an image signal, and a checking circuit 5 are formed, and on both ends of the scanning lines "gate", a scanning-side driving circuit 4 for outputting a scanning signal is formed. In these driving circuits 3 and 4, a complementary TFT is formed by an n-type TFT and a p-type TFT. This complementary TFT forms a shift register, a level shifter, an analog switch, etc. On the transparent substrate 10, a mounting pad 6, which is a group of terminals for inputting an image signal, various potentials, and a pulse signal, is formed in the peripheral region to the outside from the data-side driving circuit 3.

(Arrangement of Common Power-Feed Lines and Pixels)

In the display apparatus 1, similarly to an active-matrix substrate of a liquid-crystal display apparatus, on the transparent substrate 10, a plurality of scanning lines "gate", and a plurality of data lines "sig" which extend in a direction intersecting the extension direction of the scanning lines "gate" are formed. As shown in FIG. 2, these data lines "sig" and scanning lines "gate" form the pixels 7 in a matrix.

Each of these pixels 7 is formed with a first TFT 20 in which a scanning signal is supplied to its gate electrode 21 (first gate electrode) via the scanning lines "gate". One of the source and drain regions of the second TFT 20 is electrically connected to the data line "sig", and the other is electrically connected to a potential holding electrode "st". With respect to the scanning lines "gate". Capacitance lines "cline" are disposed in parallel, with a holding capacitor "cap" being formed between the capacitance line "cline" and the potential holding electrode "st". Therefore, when the first TFT 20 is selected by the scanning signal and is turned on, the image signal is written from the data line "sig" into the holding capacitor "cap" via the first TFT 20.

A gate electrode 31 (second gate electrode) of the second TFT 30 is electrically connected to the potential holding electrode "st". One of the source and drain regions of the second TFT 30 is electrically connected to the common power-supply lines "com", and the other is electrically connected to one of the electrodes (pixel electrode to be described later) of a light-emission element 40. The common power-supply lines "com" are maintained at a fixed potential. Therefore, when the second TFT 30 is turned on, the current in the common power-supply line "com" flows to the light-emission element 40 via this TFT, causing the light-emission element 40 to emit light.

In this embodiment, on both sides of the common power-feed lines "com", a plurality of pixels 7 to which driving current is supplied by the common power-feed lines "com" are arranged, and two data lines "sig" pass on a side opposite to the common power-feed lines "com" with respect to these pixels 7. That is, a data line "sig", a group of pixels connected thereto, one common power-feed line "com", a group of pixels connected thereto, and a data line "sig" for supplying a pixel signal to the group of pixels are assumed to be one unit. This is repeated in the extension direction of scanning lines "gate", and one common power-feed line "com" is used to supply driving current to the pixels 7 for two rows. Therefore, in this embodiment, in a section between two pixels 7 disposed in such a manner as to sandwich the common power-feed lines "com", the first TFT 20, the second TFT 30, and the light-emission elements 40 are disposed in linear symmetry about the common power-feed line "com", simplifying the electrical connection between these elements and each wiring layer. As described above, in this embodiment, since pixels for two rows are driven by one common power-feed line "com", in comparison with a case in which the common power-feed lines "com" are formed for each group of pixels for one row, one-half of the number of common power-feed lines "com" is required, and the gap secured between the common power-feed lines "com" and the data lines "sig", which is formed in the same section between the layers, is not required. Therefore, since an area for a wiring on the transparent substrate 10 can be made more narrow, the ratio of the light-emission area in each pixel area can be increased correspondingly, making it possible to improve display performance, such as luminance, contrast ratio, and so on.

Since the construction is formed in such a way that the pixels for two rows are connected to one common power-feed line "com" in this manner, the data lines "sig", which are in a state of being parallel in groups of two, supply an image signal to the group of pixels for each row.

(Structure of Pixels)

The structure of each pixel 7 of the display apparatus 1 constructed as described above will be described in detail with reference to FIGS. 3 to 6(A).

Figure 3:
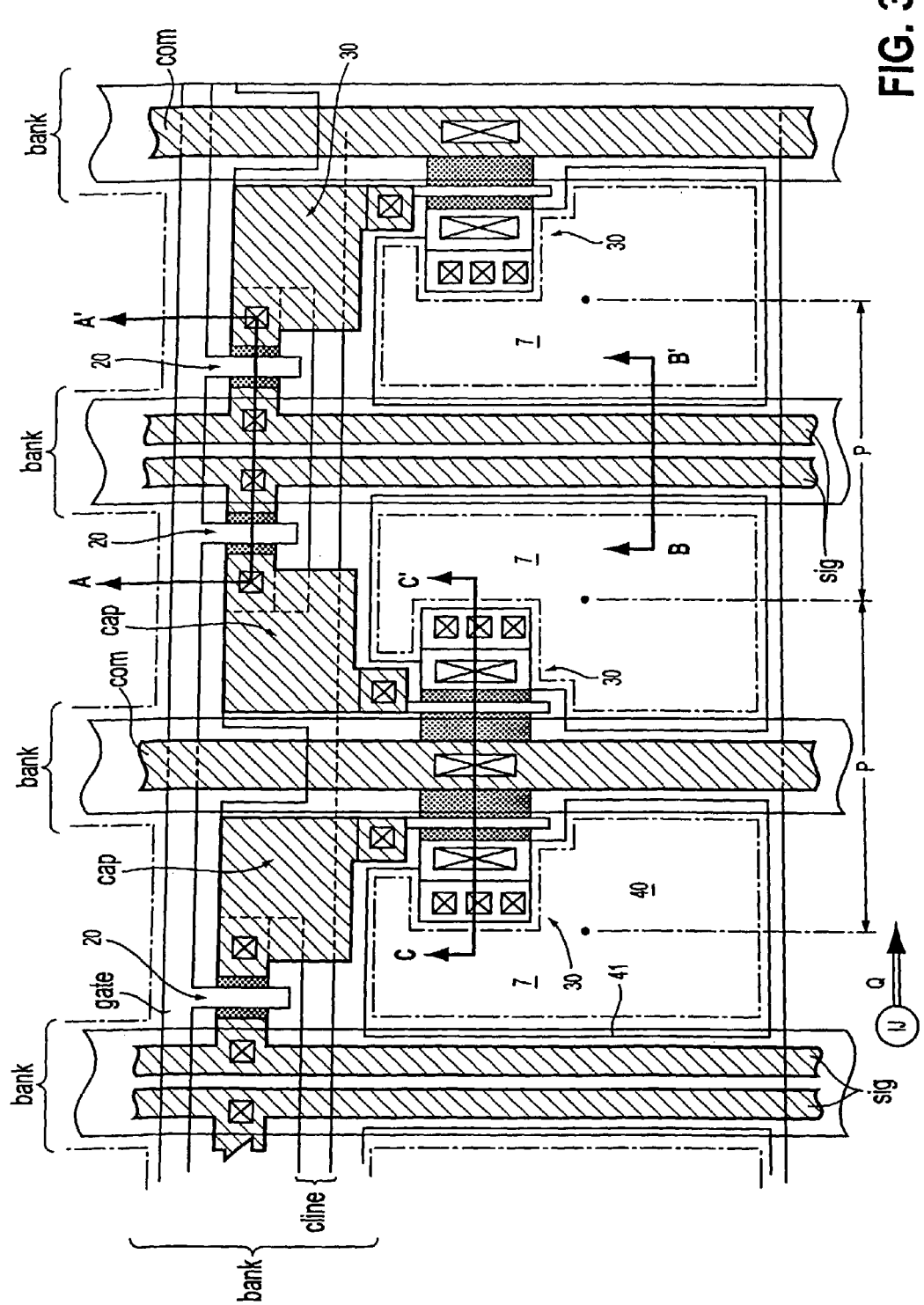
FIG. 3 is a plan view in which pixels of the display apparatus according to the first embodiment of the present invention are enlarged.
Figure 4:
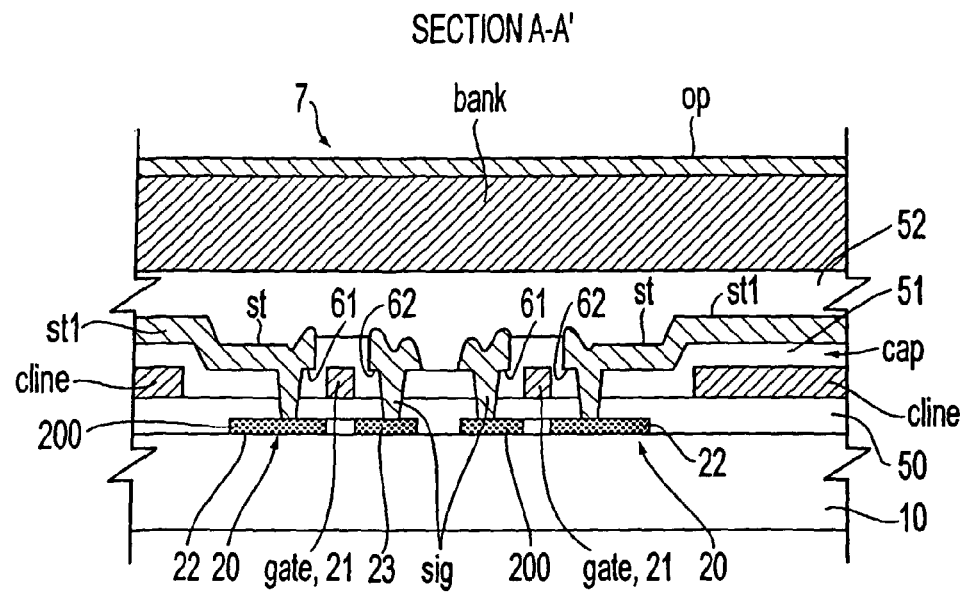
FIG. 4 is a sectional view taken along the line A-A' of FIG. 3.
Figure 5:
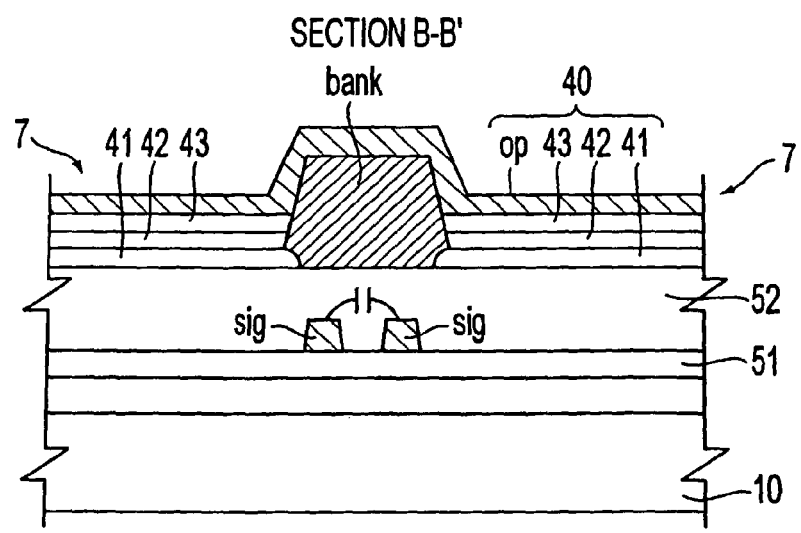
FIG. 5 is a sectional view taken along the line B-B' of FIG. 3.
Figure 6:
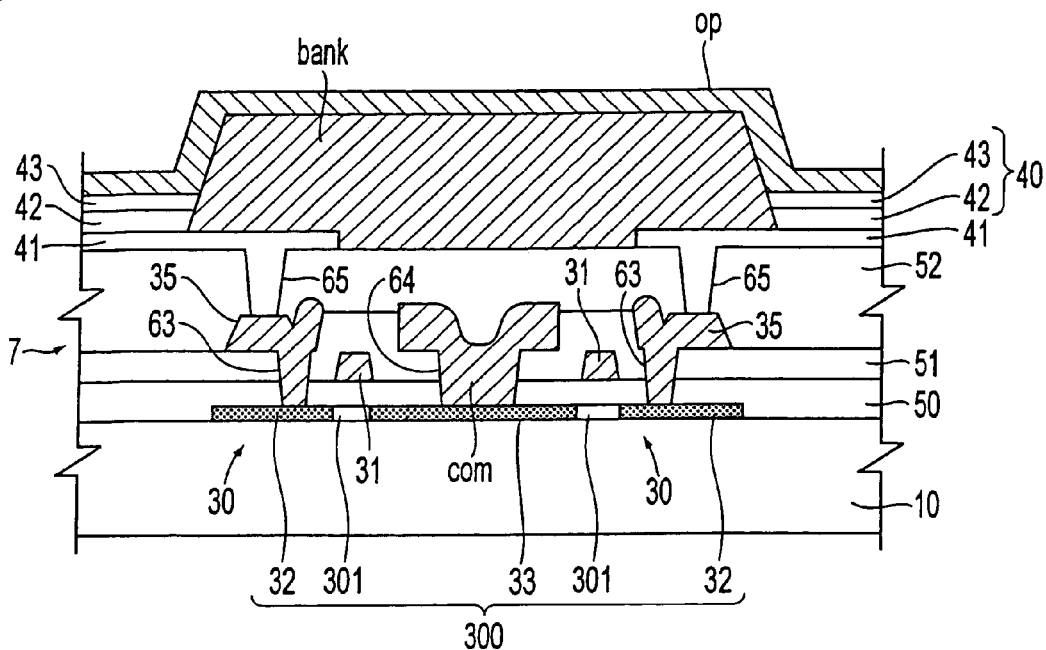
FIG. 6(A) is a sectional view along the line C-C' of FIG. 3.
FIG. 6(B) is a sectional view of the construction in which the formation area of a bank layer is not extended until it covers a relay electrode.
Figure 6:
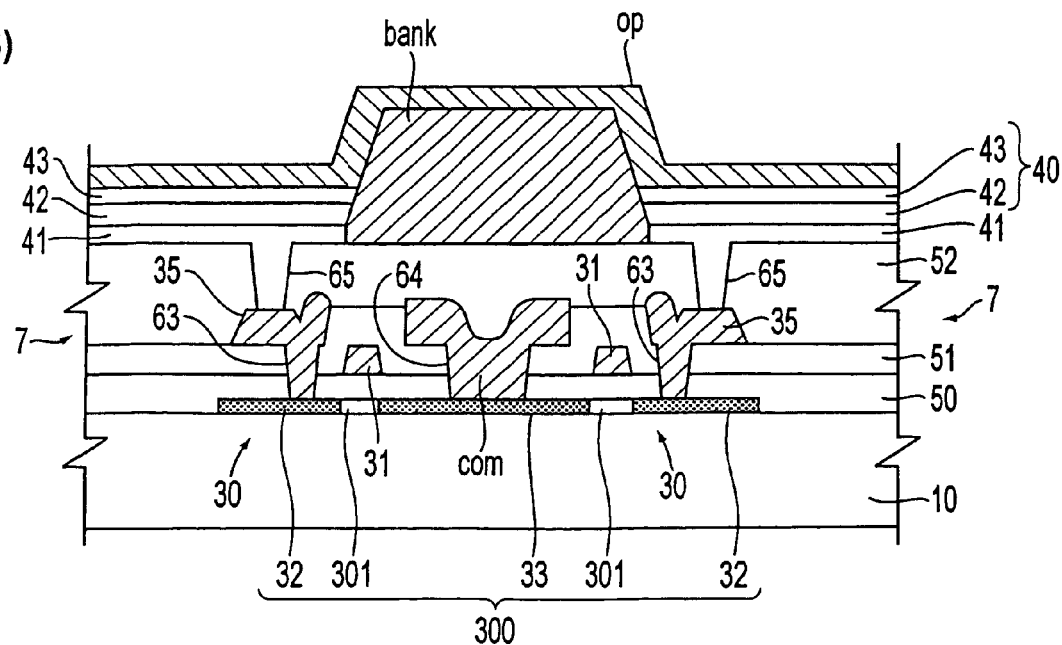

FIG. 3 is a plan view in which three pixels 7 of the plurality of pixels 7 formed in the display apparatus 1 of this embodiment are enlarged. FIGS. 4, 5, and 6(A) are respectively a sectional view along the line A-A' of FIG. 3, a sectional view along the line B-B' of FIG. 3, and a sectional view along the line C-C' of FIG. 3.

First, at a position corresponding to the line A-A' of FIG. 3, as shown in FIG. 4, in each of the pixels 7 on the transparent substrate 10, an island-shaped silicon film 200 for forming the first TFT 20 is formed, with a gate insulation film 50 being formed on the surface thereof. Further, a gate electrode 21 (a part of scanning lines "gate") is formed on the surface of the gate insulation film 50, and source and drain regions 22 and 23 are formed so as to be self-aligned with respect to the gate electrode 21. A first interlayer insulation film 51 is formed on the surface of the gate insulation film 50, and the data lines "sig" and the potential holding electrodes "st" are electrically connected to the source and drain regions 22 and 23 via contact holes 61 and 62 formed on this interlayer insulation film, respectively.

In each pixel. 7, capacitance lines "cline" are formed in the same section between the layers of the scanning lines "gate" and the gate electrodes 21 (between the gate insulation film 50 and the first interlayer insulation film 51) in such a manner as to be parallel to the scanning lines "gate", and an extended portion "st1" of the potential holding electrode "st" overlaps this capacitance line "cline" via the first interlayer insulation film 51. For this reason, the capacitance line "cline" and the extended portion "st1" of the potential holding electrode "st" form a holding capacitor "cap" in which the first interlayer insulation film 51 is a dielectric film. A second interlayer insulation film 52 is formed on the surface of the potential holding electrodes "st" and the data lines "sig".

At a position corresponding to the line B-B' in FIG. 3, as shown in FIG. 5, two data lines "sig" corresponding to each pixel 7 are parallel on the surface of the first interlayer insulation film 51 and the second interlayer insulation film 52 formed on the transparent substrate 10.

At a position corresponding to the line C-C'in FIG. 3, as shown in FIG. 6(A), an island-shaped silicon film 300 for forming the second TFT 30 is formed on the transparent substrate 10 in such a manner as to extend across two pixels 7 which sandwich the common power-feed line "com "with the gate insulation film 50 being formed on the surface thereof. On the surface of the gate insulation film 50, the gate electrode 31 is respectively formed in each of the pixels 7 in such a manner as to sandwich the common power-feed lines "com "with source and drain regions 32 and 33 being formed so as to be self-aligned in this gate electrode 31. The island-shaped silicon film 300 includes the source and drain regions 32 and 33 as well as undoped channel regions 301 disposed between the source and drains 32 and 33. The first interlayer insulation film 51 is formed on the surface of the gate insulation film 50, and the relay electrode 35 is electrically connected to a source and drain region 32 via a contact hole 63 formed in this interlayer insulation film. In contrast, the common power-feed lines "com "are electrically connected to a portion, which is a common source and drain area 33 in two pixels 7 in the central portion of the silicon film 300, via a contact hole 64 of the first interlayer insulation film 51. A second interlayer insulation film 52 is formed on the surface of the common power-feed lines "com "and the relay electrode 35. A pixel electrode 41 formed from an ITO film is formed on the surface of the second interlayer insulation film 52. This pixel electrode 41 is electrically connected to the relay electrode 35 via a contact hole 65 formed in the second interlayer insulation film 52, and is electrically connected to the source and drain regions 32 of the second TFT 30 via this relay electrode 35.

Here, the pixel electrode 41 forms one of the electrodes of the light-emission element 40. That is, a positive-hole injection layer 42 and an organic semiconductor film 43 are multilayered on the surface of the pixel electrode 41, and a counter electrode "op" formed from a lithium-containing metal film, such as aluminum or calcium, is formed on the surface of the organic semiconductor film 43. This counter electrode "op" is a common electrode formed at least on a pixel area or in a stripe form, and is maintained at a fixed potential.

Figure 7:
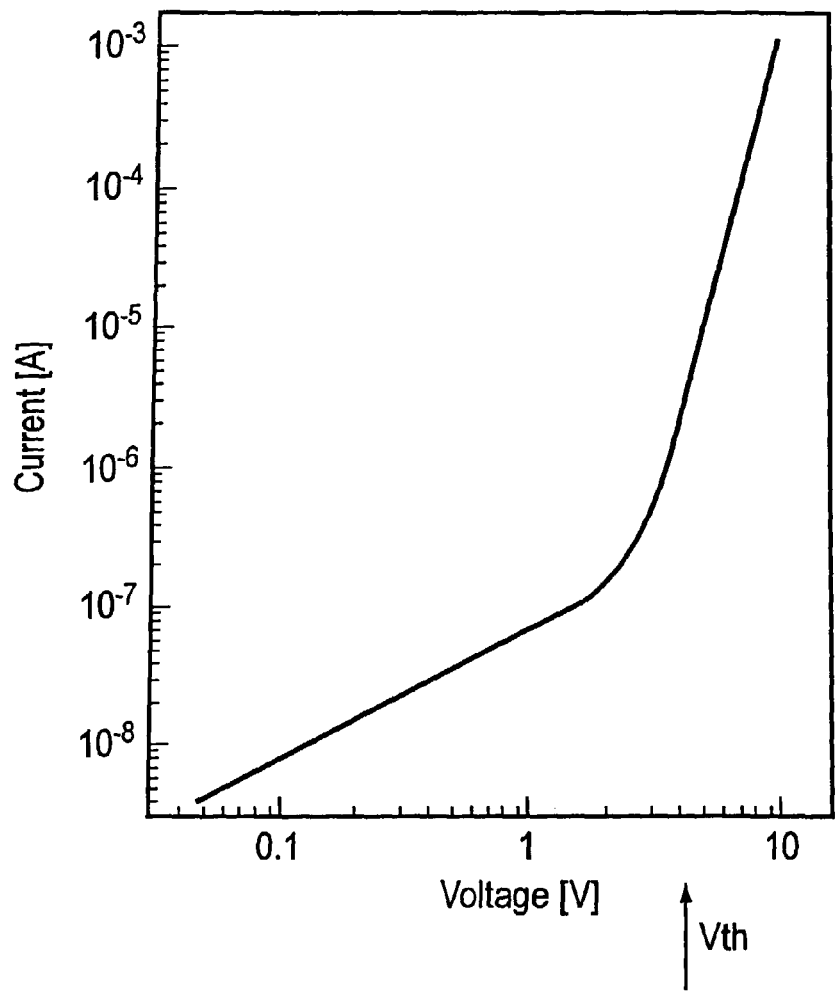
FIG. 7 is a graph showing the I-V characteristics of a light-emission element used in the display apparatus shown in FIG. 1.

In the light-emission element 40 constructed as described above, a voltage is applied by assigning the counter electrode "op" and the pixel electrode 41 as a positive pole and a negative pole, respectively. As shown in FIG. 7, the current (driving current) which flows through the organic semiconductor film 43 increases sharply in an area where the applied voltage exceeds a threshold voltage. As a result, the light-emission element 40 emits light as an electroluminescence element or an LED element. The light from the light-emission element 40 is reflected by the counter electrode "op", is passed through the transparent pixel electrode 41 and the transparent substrate 10, and is output.

Such driving current used for light emission flows through a current path formed of the counter electrode "op", the organic semiconductor film 43, the positive-hole injection layer 42, the pixel electrode 41, the second TFT 30, and the common power-feed lines "com". Therefore, when the second TFT 30 is turned off, the driving current does not flow. In the display apparatus 1 of this embodiment, when the first TFT 20 is turned on as a result of being selected by a scanning signal, the image signal is written from the data lines "sig" into the holding capacitors "cap" via the first. TFT 20. Therefore, even if the first TFT 20 is turned off, the gate electrode of the second TFT 30 is maintained at a potential corresponding to the image signal by the holding capacitor "cap", and therefore, the second TFT 30 remains in an on state. Therefore, the driving current continues to flow through the light-emission element 40, and this pixel is maintained in a switched-on state. This state is maintained until new image data is written into the holding capacitor "cap" and the second TFT 30 is turned off.

(Method of Maufacturing Display Apparatus)

In a method of manufacturing the display apparatus 1 constructed as described above, the steps up to manufacturing the first TFT 20 and the second TFT 30 on the transparent substrate 10 are nearly the same as the steps for manufacturing an active-matrix substrate of the display apparatus 1, and accordingly, are described in general outline with reference to FIGS. 8(A)-(G).

Figure 8:
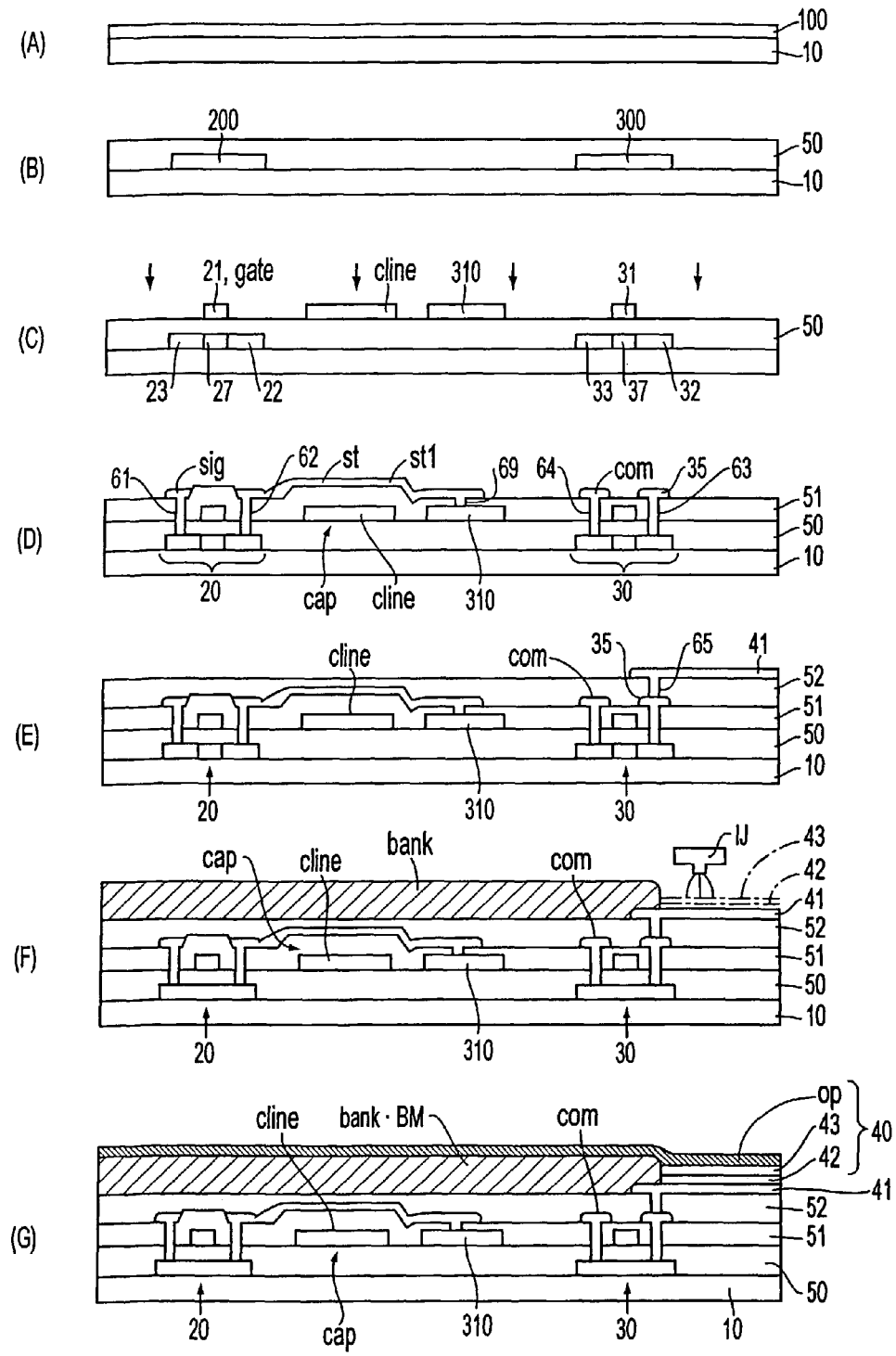
FIGS. 8(A)-(G) includes step sectional views showing a method of manufacturing a display apparatus of the present invention.

FIGS. 8(A)-(G) includes step sectional views schematically showing the process of forming each component of the display apparatus 1. More specifically, as shown in FIG. 8(A), using a TEOS (tetraethoxysilane), oxygen gas, and the like as a starting-material gas as required, a base protective film (not shown) formed from a silicon oxide film having a thickness of approximately 2000 to 5000 angstroms is formed on the transparent substrate 10 by a plasma CVD method. Next, the temperature of the substrate is set to approximately 350° C., and a semiconductor film 100 formed from an amorphous silicon film having a thickness of approximately 300 to 700 angstroms is formed on the surface of the base protective film by a plasma CVD method. Next, a crystallization step, such as laser annealing or a solid-phase growth method, is performed on the semiconductor film 100 formed from an amorphous silicon film so that the semiconductor film 100 is crystallized into a polysilicon film. In the laser annealing method, for example, a line beam forming a spot having a major axis of 400 mm is used in the excimer laser, and its output intensity is, for example, 200 mJ/cm. The line beam is scanned in such a way that, for the line beam, a portion corresponding to 90% of the peak value of the laser intensity in the minor axis thereof overlaps in each area.

Next, as shown in FIG. 8(B), the semiconductor film 100 is patterned into island-shaped silicon films 200 and 300, and a gate insulation film 50 formed from a silicon oxide film or a nitride film having a thickness of approximately 600 to 1500 angstroms is formed on the surface of the silicon films 200 and 300 by a plasma CVD method by using TEOS (tetraethoxysilane) or oxygen gas as a starting-material gas.

Next, as shown in FIG. 8(C), a conductive film formed from a metal film, such as aluminum, tantalum, molybdenum, titanium, or tungsten, is formed by a sputtering method, after which it is patterned in order to form gate electrodes 21 and 31 as a part of the scanning lines "gate". In this step, the capacitance lines "cline" are also formed. In the figure, reference numeral 310 denotes an extended portion of the gate electrode 31.

In this state, high-concentration phosphor ions or boron ions are implanted to form source and drain regions 22, 23, 32, and 33 in a self-aligned manner with respect to the gate electrodes 21 and 31 in the silicon thin-films 200 and 300. The portions where impurities are not introduced become channel areas 27 and 37.

Next, as shown in FIG. 8(D), after the first interlayer insulation film 51 is formed, contact holes 61, 62, 63, 64, and 69 are formed, and a potential holding electrode "st" comprising an extended portion "st1" overlapping the data lines "sig", the capacitance lines "cline", and the extended portion 310 of the gate electrode 31, a common power-feed line "com", and the relay electrode 35 are formed. As a result, the potential holding electrode "st" is electrically connected to the gate electrode 31 via a contact hole 69 and the extended portion 310. In this way, the first TFT 20 and the second TFT 30 are formed. Further, the holding capacitor "cap" is formed by the capacitance line "cline" and the extended portion "st1" of the potential holding electrode "st".

Next, as shown in FIG. 8(E), the second interlayer insulation film 52 is formed, and in this interlayer insulation film, a contact hole 65 is formed in a portion corresponding to the relay electrode 35. Next, after the ITO film is formed over the entire surface of the second interlayer insulation film 52, the film is patterned, forming a pixel electrode 41 which is electrically connected to the source and drain regions 32 of the second TFT 30 via the contact hole 65.

Next, as shown in FIG. 8(F), after a black resist layer is formed on the surface of the second interlayer insulation film 52, this resist is left in such a manner as to surround an area where the positive-hole injection layer 42 and the organic semiconductor film 43 of the light-emission element 40 should be formed, forming a bank layer "bank". Here, for the organic semiconductor film 43, in any shape in a case in which the film is formed independently for each pixel, or in a case in which the film is formed in a stripe form along the data lines "sig" a manufacturing method according to this embodiment can be applied by merely forming the bank layer "bank" in a shape corresponding thereto.

Next, a liquid material (precursor) for forming the positive-hole injection layer 42 is discharged from an ink-jet head IJ with respect to the inside area of the bank layer "bank", and the positive-hole injection layer 42 is formed in the inside area of the bank layer "bank". In a similar manner, a liquid material (precursor) for forming the organic semiconductor film 43 is discharged from the ink-jet head IJ with respect to the inside area of the bank layer "bank", and the organic semiconductor film 43 is formed in the inside area of the bank layer "bank". Here, since the bank layer "bank" is formed from a resist, it is water repellent. In contrast, since the precursor of the organic semiconductor film 43 mainly uses a hydrophilic solvent, the coating area of the organic semiconductor film 43 is reliably defined by the bank layer "bank", and extrusion into adjacent pixels does not occur.

When forming the organic semiconductor film 43 and the positive-hole injection layer 42 by an ink-jet method in this manner, in this embodiment, in order to improve the operation efficiency and the injection position accuracy, as shown in FIG. 3, the pitch P of the centers of the formation areas of the organic semiconductor films 43 is made equal at every interval of the adjacent pixels 7 along the extension direction of the scanning lines "gate". Therefore, as indicated by the arrow Q, since a material for the organic semiconductor film 43 may be discharged from the ink-jet head IJ at positions at even intervals along the extension direction of the scanning lines "gate", there is the advantage in that the operation efficiency is superior. Further, the movement control mechanism of the ink-jet head IJ is simplified, and the implantation position accuracy is improved.

Subsequently, as shown in FIG. 8(G), the counter electrode "op" is formed on the surface of the transparent substrate 10. Here, the counter electrodes "op" are formed at least over the entire surface of the pixel area or in a stripe form. When the counter electrodes "op" are formed in a stripe form, after a metal film is formed over the entire surface of the transparent substrate 10, the metal film is patterned in a stripe form.

Since the bank layer "bank" is formed from a resist, it is left intact, and as will be described below, the layer is used as a black matrix BM and an insulation layer for reducing parasitic capacitance.

TFTs are formed also in the data-side driving circuit 3 and the scanning-side driving circuit 4 shown in FIG. 1. These TFTs are formed by borrowing the entirety or a part of the steps for forming the TFT in the pixels 7. Therefore, the TFT which forms a driving circuit is also formed in the same section between the layers as those of the TFTs of the pixels 7.

Further, both the first TFT 20 and the second TFT 30 may be of n-type, or p-type, or one of them may be of n-type and the other of p-type. In any combination of these cases, TFTs can be formed by a well known method, and accordingly, description thereof has been omitted.

(Formation Area of Bank Layer)

In this embodiment, with respect to the entirety of the peripheral area of the transparent substrate 10 shown in FIG. 1, the bank layer "bank "(the formation area is shaded) is formed. Therefore, both the data-side driving circuit 3 and the scanning-side driving circuit 4 are covered with the bank layer "bank ". For this reason, even if the counter electrodes "op "are in an overlapping state with respect to the formation area of these driving circuits, the bank layer "bank "is interposed between the wiring layers and the counter electrodes "op" of the driving circuits. Therefore, since parasitization of a capacitance into the driving circuits 3 and 4 can be prevented, the load of the driving circuits 3 and 4 can be reduced, thereby making it possible to reduce power consumption or to achieve a higher speed of the display operation.

Here, unlike the data lines "sig", a large current for driving the light-emission elements 40 flows through the common power-feed lines "com", and the driving current is supplied to the pixels for two rows. For this reason, for the common power-feed lines "com", their line width is set to be wider than the line width of the data lines "sig", and the resistance value per unit length of the common power-feed lines "com" is set to be smaller than the resistance value per unit length of the data lines "sig". Even under such design conditions, in this embodiment, when the bank layer "bank" is formed so as to overlap the common power-feed lines "com" and the formation area of the organic semiconductor film 43 is defined, the width of the bank layer "bank" to be formed here is made at the same width dimension as that of the bank layer "bank" overlapping two data lines "sig", forming a construction suitable for making the pitch P of the centers of the formation areas of the organic semiconductor films 43 equal at any interval between the adjacent pixels 7 along the extension direction of the scanning lines "gate".

Furthermore, in this embodiment, as shown in FIGS. 3, 4, and 6(A), the bank layer "bank" is also formed in an area overlapping the formation area of the first TFT 20 and the formation area of the second TFT 30 from among the formation area of the pixel electrode 41. That is, as shown in FIG. 6(B), unless the bank layer "bank" is formed in an area overlapping the relay electrode 35, even if driving current flows to a section adjoining the counter electrode "op" and the organic semiconductor film 43 emits light, this light is not output because it is sandwiched between the relay electrode 35 and the counter electrode "op", and does not contribute to display. Such driving current flowing in a portion which does not contribute to display may be said to be a reactive current from the point of view of display. However, in this embodiment, the bank layer "bank" is formed in a portion where such reactive current should flow so that the flowing of the driving current thereinto is prevented, making it possible to prevent wasteful current from flowing into the common power-feed lines "com". Therefore, the width of the common power-feed lines "com" may be narrower correspondingly.

Also, if the bank layer "bank" which is formed by a black resist as described above remains, the bank layer "bank" functions as a black matrix, improving display quality, such as luminance, contrast ratio, etc. That is, in the display apparatus 1 according to this embodiment, since the counter electrodes "op" are formed on the entire surface of the transparent substrate 10 or in a stripe form over a wide area thereof, light reflected by the counter electrodes "op" causes the contrast ratio to decrease. However, in this embodiment, since the bank layer "bank" having the function of inhibiting the parasitic capacitance is formed by a black resist while defining the formation area of the organic semiconductor film 43, the bank layer "bank" functions also as a black matrix, and shuts off reflected light from the counter electrodes "op", yielding an advantage in that the contrast ratio is high. Further, since the light-emission area can be defined in a self-aligned manner by using the bank layer "bank", alignment allowance with the light-emission area, which is a problem when the bank layer "bank" is not used as a black matrix and another metal layer is used as a black matrix, is not required.

[Example of an Improvement of the Above-Described Embodiment]

Figure 9:
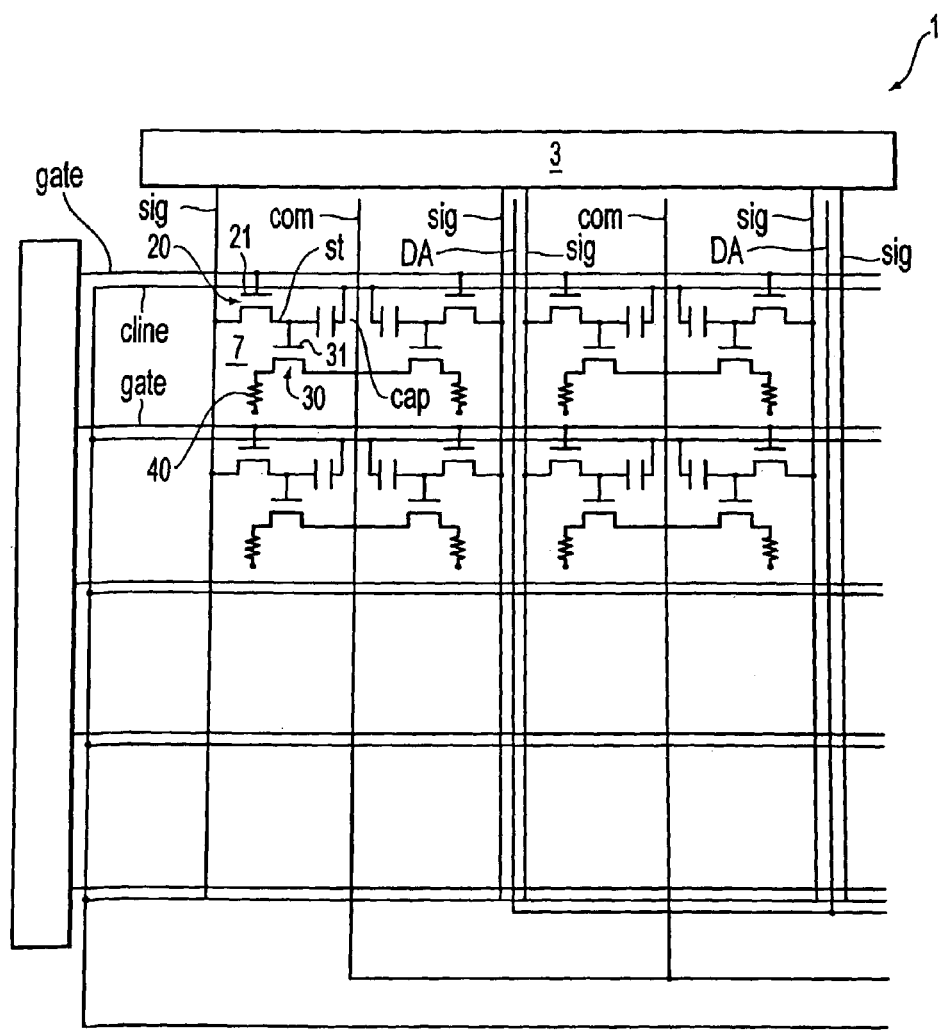
FIG. 9 is a block diagram showing an example of an improvement of the display apparatus shown in FIG. 1.
Figure 10:
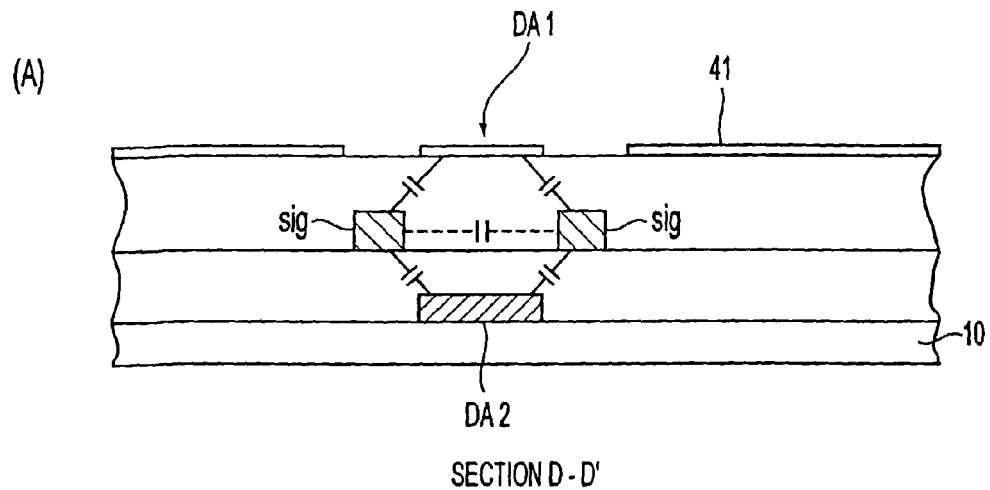
FIG. 10(A) is a sectional view showing a dummy wiring layer formed in the display apparatus shown in FIG. 9.
FIG. 10(B) is a plan view thereof.
Figure 10:
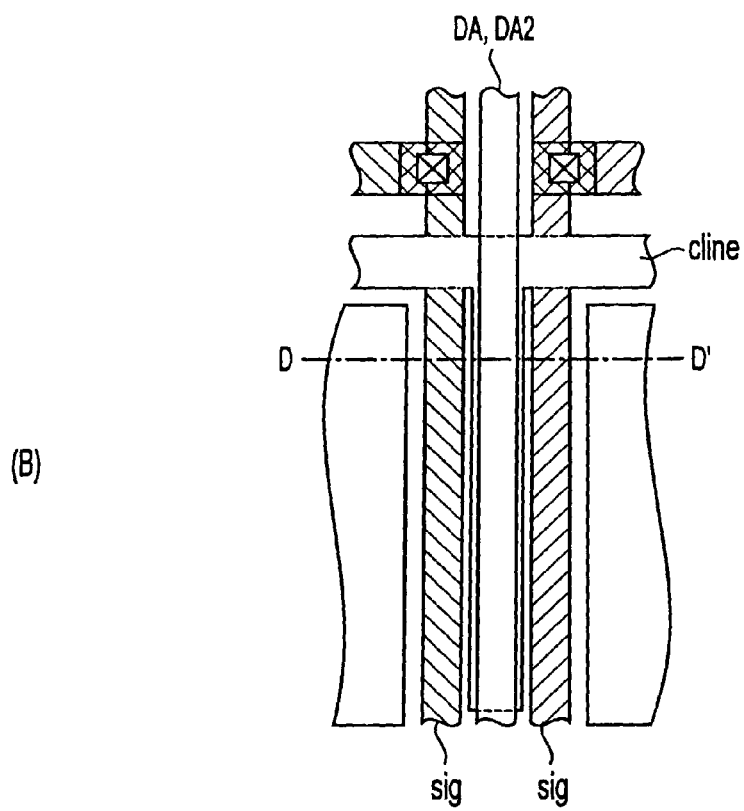

In the above-described embodiment, pixels 7, to which driving current flows in a section between the pixels and the common power-feed lines "com", are arranged on each of the two sides of the common power-feed lines "com", and two data lines "sig" pass in parallel on a side opposite to the common power-feed lines "com" with respect to the pixels 7. Therefore, there is a risk that crosstalk might occur between the two data lines "sig". Accordingly, in this embodiment, as shown in FIGS. 9, 10(A), and 10(B), a dummy wiring layer DA is formed at a position corresponding to a section between the two data lines "sig". As this dummy wiring layer DA, for example, an ITO film DA1, which is formed at the same time as the pixel electrode 41, can be used. Further, as the dummy wiring layer DA, an extended portion DA2 from the capacitance lines "cline" may be formed between two data lines "sig". Both of them may be used as dummy wiring layer DA.

When the construction is formed in this manner, since a wiring layer DA different from the above passes between two parallel data lines "sig", the above-mentioned crosstalk can be prevented by merely maintaining such wiring layer DA (DA1, DA2) at a fixed potential within at least one horizontal scanning period of the image. That is, whereas the film thickness of the first interlayer insulation film 51 and the second interlayer insulation film 52 is approximately 1 μm, the interval between two data lines "sig" is approximately 2 μm or more. Therefore, in comparison with capacitance formed between each data line "sig" and the dummy wiring layer DA (DA1, DA2), the capacitance formed between the two data lines "sig" is small enough that it can be effectively ignored. Therefore, since a signal of a high frequency which leaks from the data lines "sig" is absorbed in the dummy wiring layers DA and DA2, crosstalk between the two data lines "sig" can be prevented.

Furthermore, between two adjacent data lines "sig" of a plurality of data lines "sig", it is preferable that sampling of an image signal be performed at the same timing. When the construction is formed in this manner, since potential variations during sampling occur simultaneously between two data lines "sig", it is possible to more reliably prevent crosstalk between these two data lines "sig".

[Another Example of Construction of Holding Capacitor]

Although in the above-described embodiment, capacitance lines "cline" are formed to form a holding capacitor "cap", as described in the description of the related art, the holding capacitor "cap" may be formed by using a polysilicon film for forming a TFT.

Figure 11:
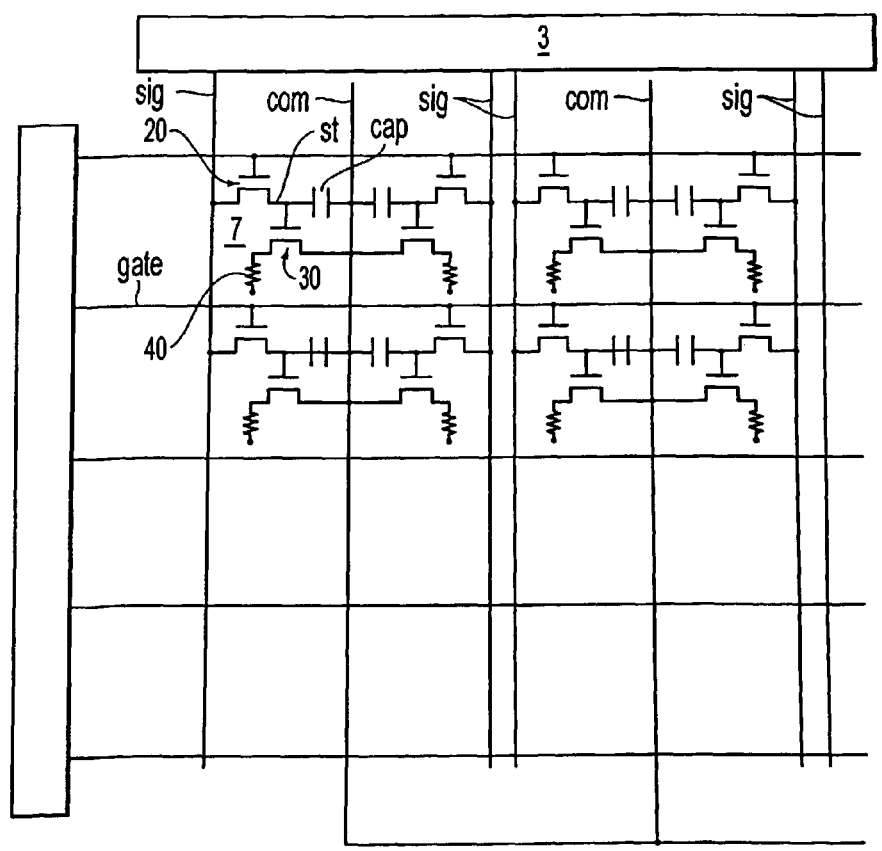
FIG. 11 is a block diagram showing a modification of the display apparatus shown in FIG. 3.
Figure 12:
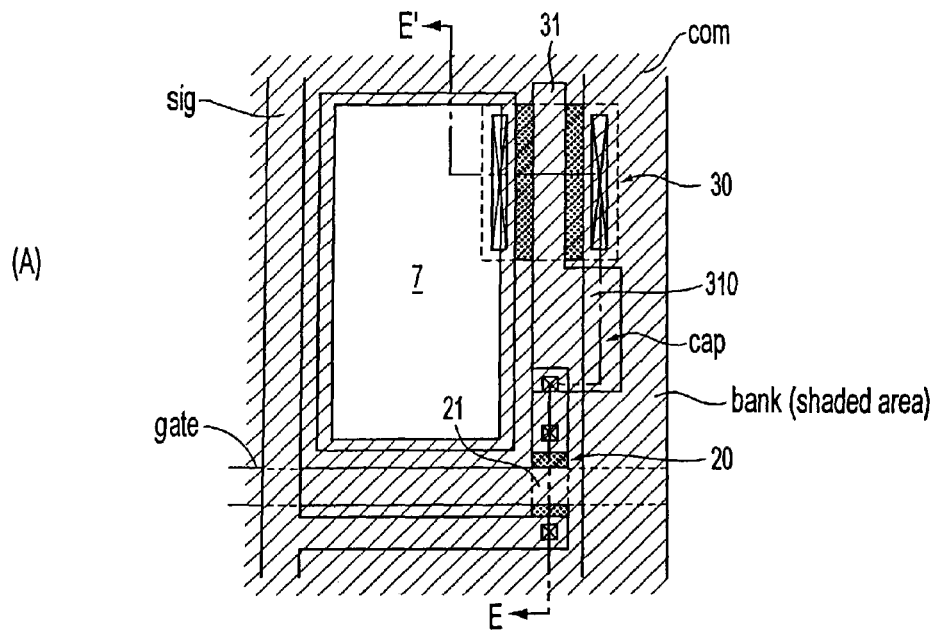
FIG. 12(A) is a plan view in which a pixel formed in the display apparatus shown in FIG. 11 is enlarged.
FIG. 12(B) is a sectional view thereof.
Figure 12:
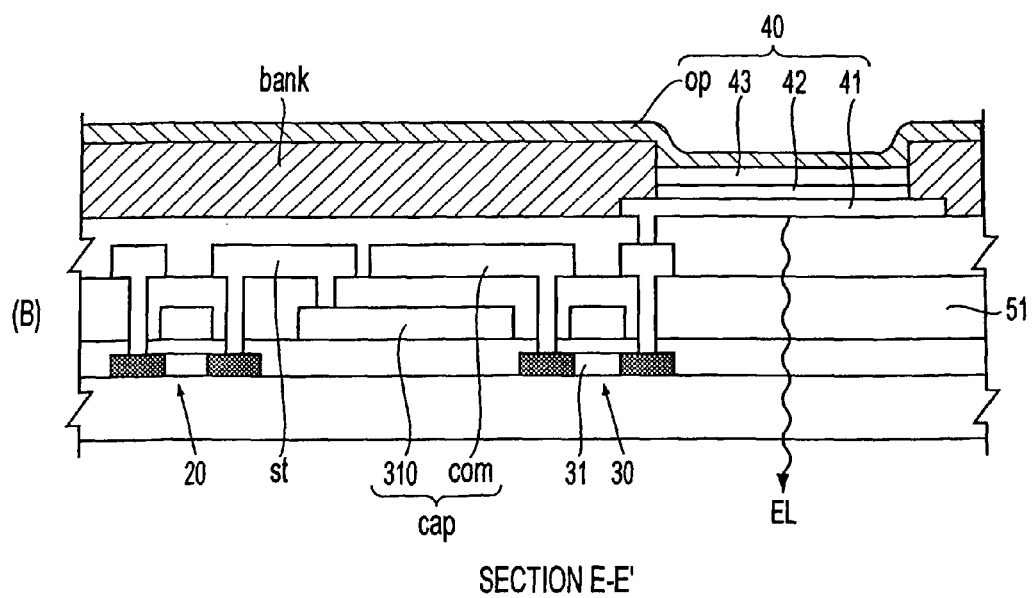

Also, as shown in FIG. 11, the holding capacitor "cap" may be formed between the common power-feed line "com" and the potential holding electrode "st". In this case, as shown in FIGS. 12(A) and 12(B), the extended portion 310 of the gate electrode 31 for electrically connecting the potential holding electrode "st" to the gate electrode 31 may be extended to the side of the lower layers of the common power-feed lines "com" and the holding capacitor "cap" may be formed by using the first interlayer insulation film 51 positioned between this extended portion 310 and the common power-feed line "com" as a dielectric film.

Second Embodiment

Although in the above-described first embodiment, the construction is formed in such a way that the light-emission elements 40 are driven by driving current of the same polarity in any pixel 7, as will be described below, the construction may be formed in such a way that the same number of two types of pixels 7, in which the light-emission elements 40 are driven by a driving current whose polarity is inverted, are among a plurality of pixels 7 to which driving current is passed in a section between the pixels and the same common power-feed line "com".

Figure 13:
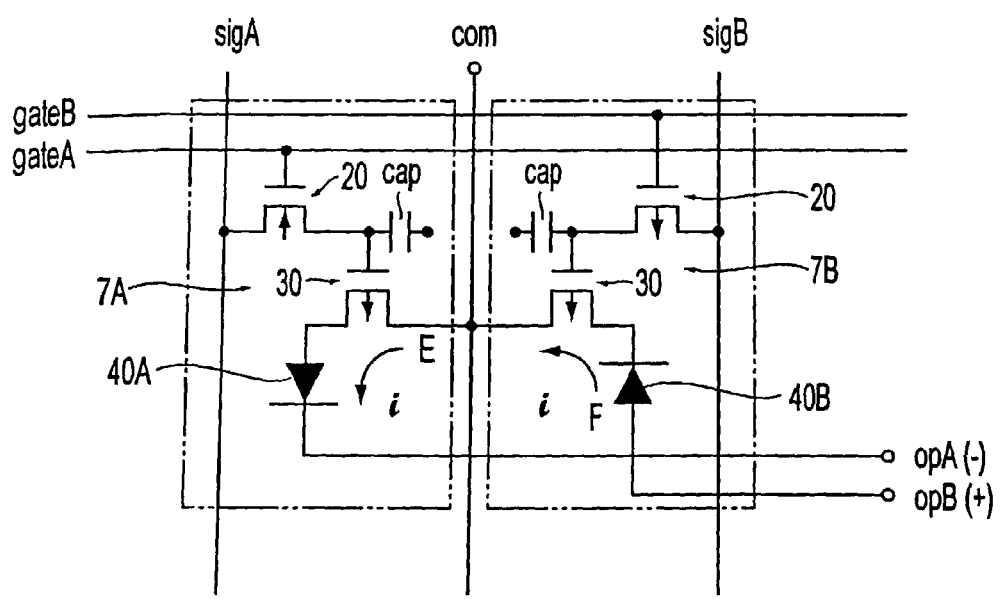
FIG. 13 is an equivalent circuit diagram showing the construction of two pixels in which the driving current is inverted which are formed in a display apparatus according to a second embodiment of the present invention.
Figure 14:
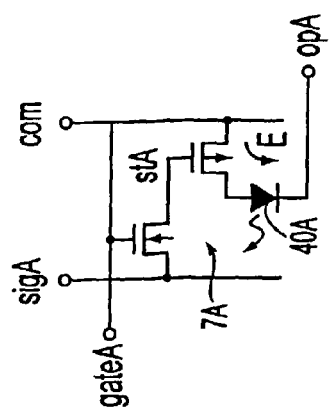
FIG. 14 is a waveform chart of each signal for driving one of the two pixels shown in FIG. 13.
Figure 14:
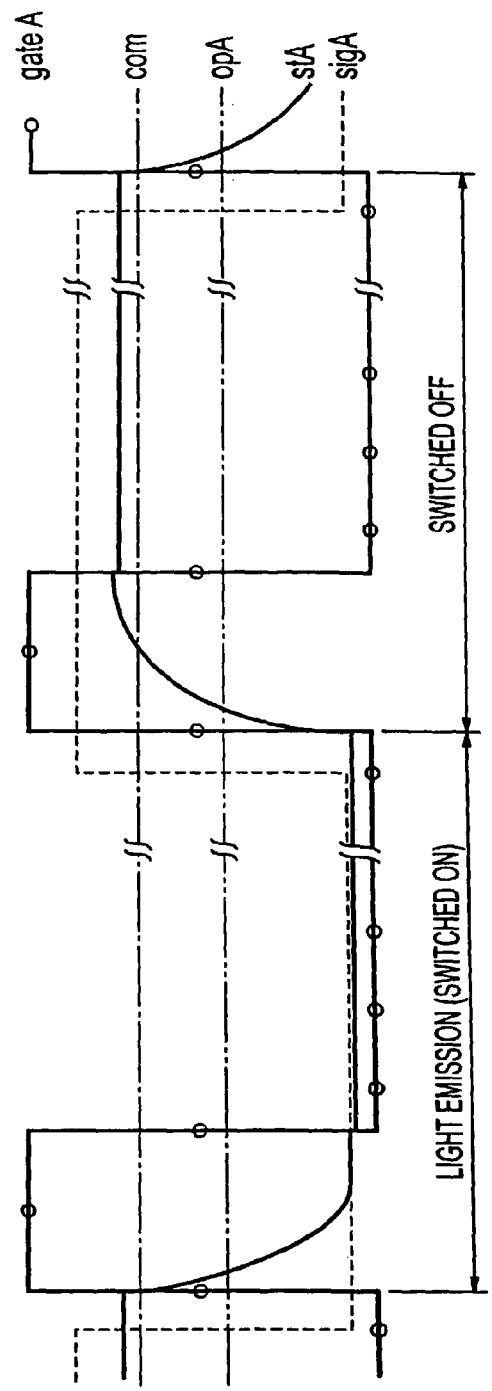
Figure 15:
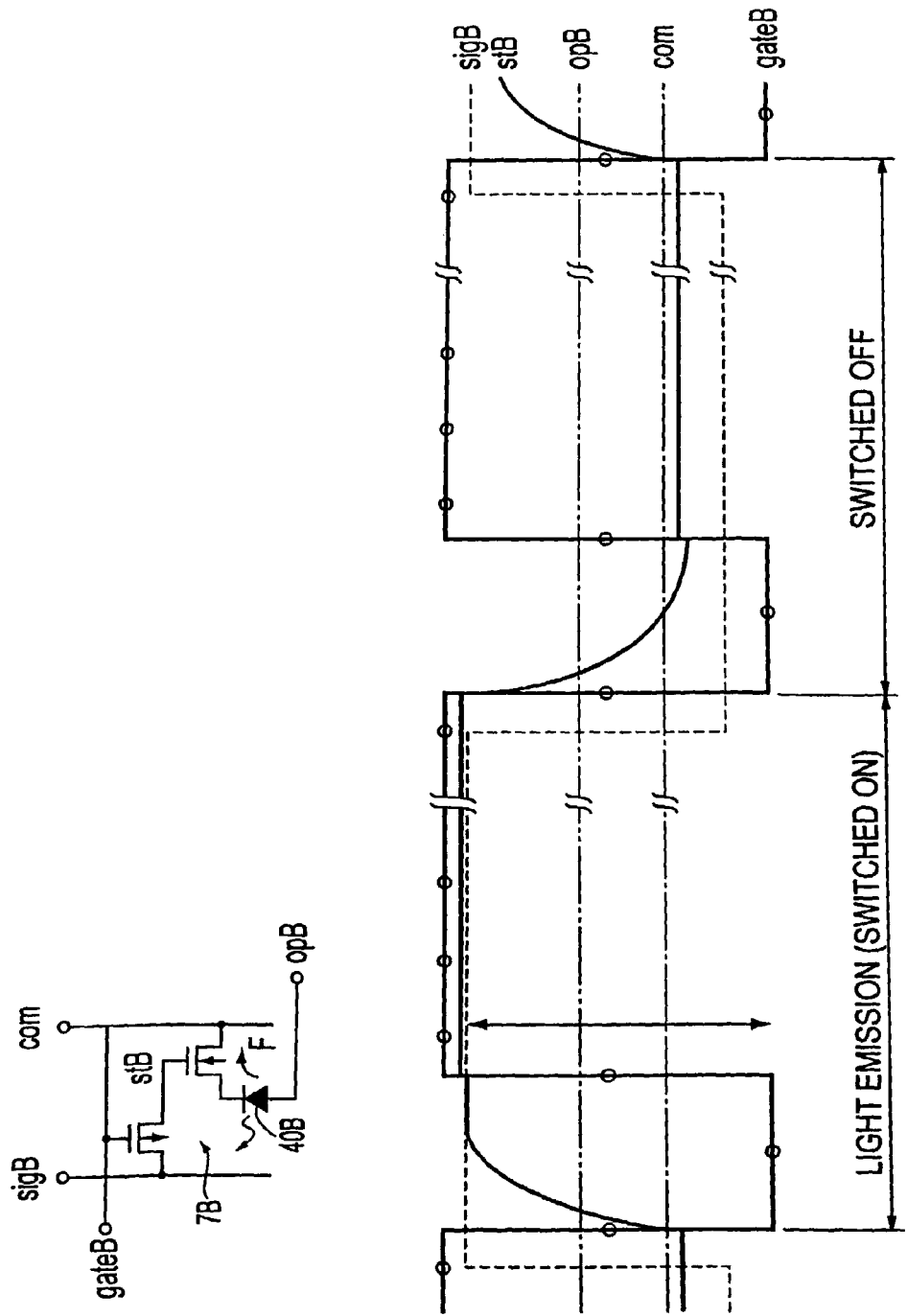
FIG. 15 is a waveform chart of each signal for driving the other of the two pixels shown in FIG. 13.

Examples of such constructions are described with reference to FIGS. 13 to 17. FIG. 13 is a block diagram of an embodiment in which two types of pixels, in which the light-emission elements 40 are driven by a driving current whose polarity is inverted, are structured. FIGS. 14 and 15 are each an illustration of a scanning signal, an image signal, the potential of common power-feed lines, and a potential of a potential holding electrode when the light-emission element 40 is driven by a driving current whose polarity is inverted.

In this embodiment and the embodiments to be described later, as shown in FIG. 13, when driving the light-emission element 40 by driving current i whose polarity is inverted, in a pixel 7A to which driving current flows from the common power-feed lines "com" as indicated by an arrow E, the first TFT 20 is formed of an n-channel type, and in a pixel 7B from which driving current flows to the common power-feed lines "com" as indicated by an arrow F, the first TFT 20 is formed of a p-channel type. For this reason, a scanning line "gateA" and a scanning line "gateB" are formed in these two types of pixels 7A and 7B, respectively. Also, in this embodiment, if the second TFT 30 of the pixel 7A is formed of a p-channel type, the second TFT 30 of the pixel 7B is formed of an n-channel type, the first TFT 20 and the second TFT 30 being formed to be a reverse-conduction type in each of the pixels 7A and 7B. Therefore, for the image signals supplied respectively via a data line "sigA" corresponding to the pixel 7A and a data line "sigB" corresponding to the pixel 7B, their polarities are inverted, as will be described later.

Furthermore, in each of the pixels 7A and 7B, since the light-emission element 40 is driven by the driving current i whose polarity is inverted, as described later, the construction must be formed in such a way that the potential of the counter electrode "op" also has an opposite polarity when the potential of the common power-feed line "com" is used as a reference. Therefore, the counter electrode "op" is formed in such a way that the pixels 7A and 7B, to which the driving current i having the same polarity flows, are connected together and a predetermined potential is applied to each of them.

Therefore, as shown in FIGS. 14 and 15, for the pixels 7A and 7B, waveforms of scanning signals supplied via the scanning lines "gateA" and "gateB", waveforms of image signals supplied via the data lines "sigA" and "sigB", the potential of the counter electrode "op", the potentials of potential holding electrodes "stA" and "stB" are shown by using the potential of the common power-feed lines "com" as a reference, respectively. Between the pixels 7A and 7B, each signal is set to have an opposite polarity in both the switched-on period and the switched-off period.

Also, as shown in FIGS. 16(A) and 16(B), light-emission elements 40A and 40B of different constructions are formed in the pixels 7A and 7B, respectively. That is, in the light-emission element 40A formed in the pixel 7A, from the side of the lower layers toward the side of the upper layers, the pixel electrode 41 formed from an ITO film, the positive-hole injection layer 42, the organic semiconductor film 43, and the counter electrode "opA" are multilayered in this sequence. In contrast, in the light-emission element 40B formed in the pixel 7B, from the side of the lower layers toward the side of the upper layers, the pixel electrode 41 formed from an ITO film, a lithium-containing aluminum electrode 45, which is so thin as to have a light transmission property, the organic semiconductor film 43, the positive-hole injection layer 42, an ITO film layer 46, and a counter electrode "opB" are multilayered in this sequence. Therefore, even though driving current of an opposite polarity flows through the light-emission elements 40A and 40B, respectively, since the structures of the electrode layers with which the positive-hole injection layer 42 and the organic semiconductor film 43 are in direct contact are the same, the light-emission characteristics of the light-emission elements 40A and 40B are identical.

When forming such two types of light-emission elements 40A and 40B, since each of both the organic semiconductor film 43 and the positive-hole injection layer 42 is formed in the inside of the bank layer "bank" by an ink-jet method, even if the top and bottom positions are reversed, the manufacturing steps are not complex. Further, in the light-emission element 40B, in comparison with the light-emission element 40A, the lithium-containing aluminum electrode 45, which is so thin as to have a light transmission property, and the ITO film layer 46 are added. Nevertheless, even if the lithium-containing aluminum electrode 45 is structured so as to be multilayered in the same area as that of the pixel electrode 41, no problem is posed for the display, and even if the ITO film layer 46 is also structured so as to be multilayered in the same area as that of the counter electrode "opB", no problem is posed for the display. Therefore, the lithium-containing aluminum electrode 45 and the pixel electrode 41 may be patterned independently of each other, but may be patterned collectively by the same resist mask. In a similar manner, the ITO film layer 46 and the counter electrode "opB" may be patterned independently of each other, but may be patterned collectively by the same resist mask. It is a matter of course that the lithium-containing aluminum electrode 45 and the ITO film layer 46 may be formed only within the inside area of the bank layer "bank".

Figure 16:
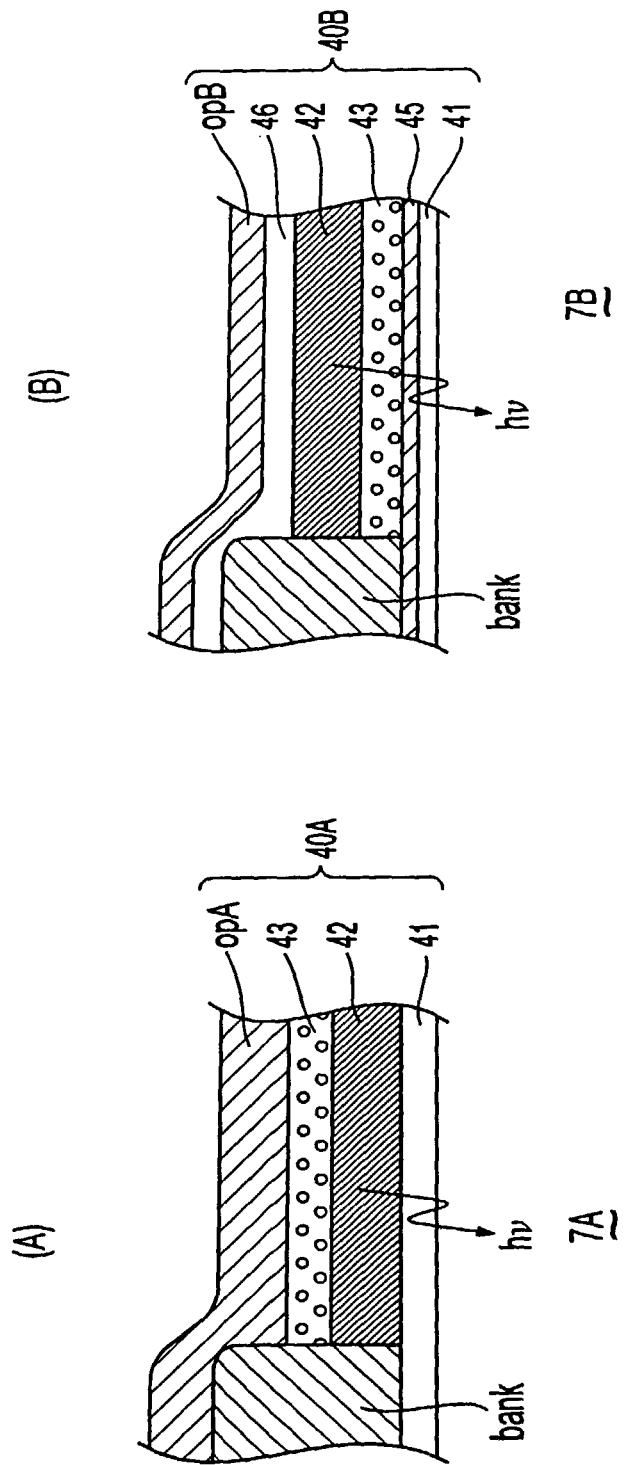
FIGS. 16(A)-(B) are sectional views showing the construction of light-emission elements formed in the two pixels shown in FIG. 13.
Figure 17:
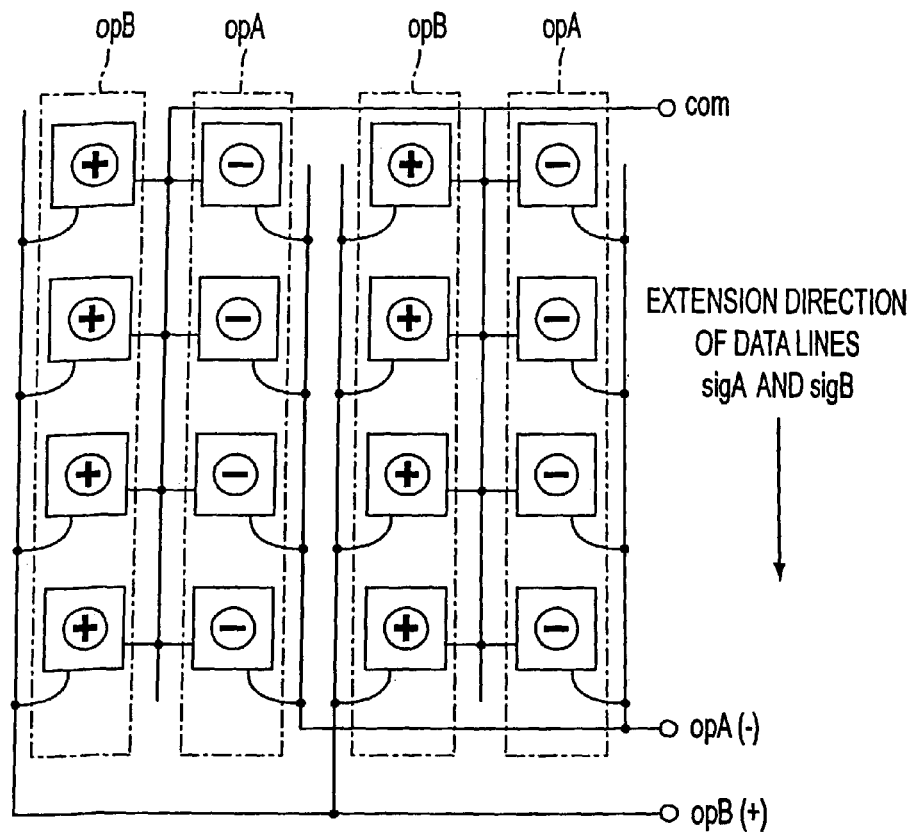
FIG. 17 includes an illustration showing the arrangement of pixels in the display apparatus shown in FIG. 13.

After the light-emission elements 40A and 40B are made to be capable of being driven by a driving current whose polarity is inverted in each of the pixels 7A and 7B in this manner, the two types of pixels 7A and 7B are arranged as shown in FIG. 17. In this figure, the pixel given the sign (−) corresponds to the pixel 7A described with reference to FIGS. 13, 14, and 16, and the pixel given the sign (+) corresponds to the pixel 7B described with reference to FIGS. 13, 15, and 16. In FIG. 17, the illustration of the scanning lines "gateA" and "gate", and the data lines "sigA" and "sigB" is omitted.

As shown in FIG. 17, in this embodiment, the polarity of the driving current in each pixel is the same along the extension direction of the data lines "sigA" and "sigB", and along the extension direction of the scanning lines "gateA" and "gateB", the polarity of the driving current in each pixel is inverted for each pixel. As the formation areas of the counter electrodes "opA" and "opB" corresponding to each pixel are indicated by a dotted-chain line, respectively, each of the counter electrodes "opA" and "opB" is constructed so as to connect together the pixels 7A and 7B to which driving current having the same polarity flows. That is, the counter electrodes "opA" and "opB" are formed in a stripe form independently of each other along the extension direction of the data lines "sigA" and "sigB", and a negative potential and a positive potential when the potential of the common power-feed line "com" is used as a reference are applied to the counter electrodes "opA" and "opB", respectively.

Therefore, between each of the pixels 7A and 7B and the common power-feed line "com", driving currents i in a direction indicated by arrows E and F in FIG. 13 flow, respectively. For this reason, since the current which flows substantially through the common power-feed line "com" is cancelled by the driving current i of a different polarity, a smaller amount of the driving current flowing through the common power-feed lines "com" is required. Therefore, since the common power-feed lines "com" can be made correspondingly narrower, it is possible to increase the ratio of the light-emission area of the pixel area in the pixels 7A and 7B and to improve display performance, such as luminance, contrast ratio, and so on.

Third Embodiment

Figure 18:
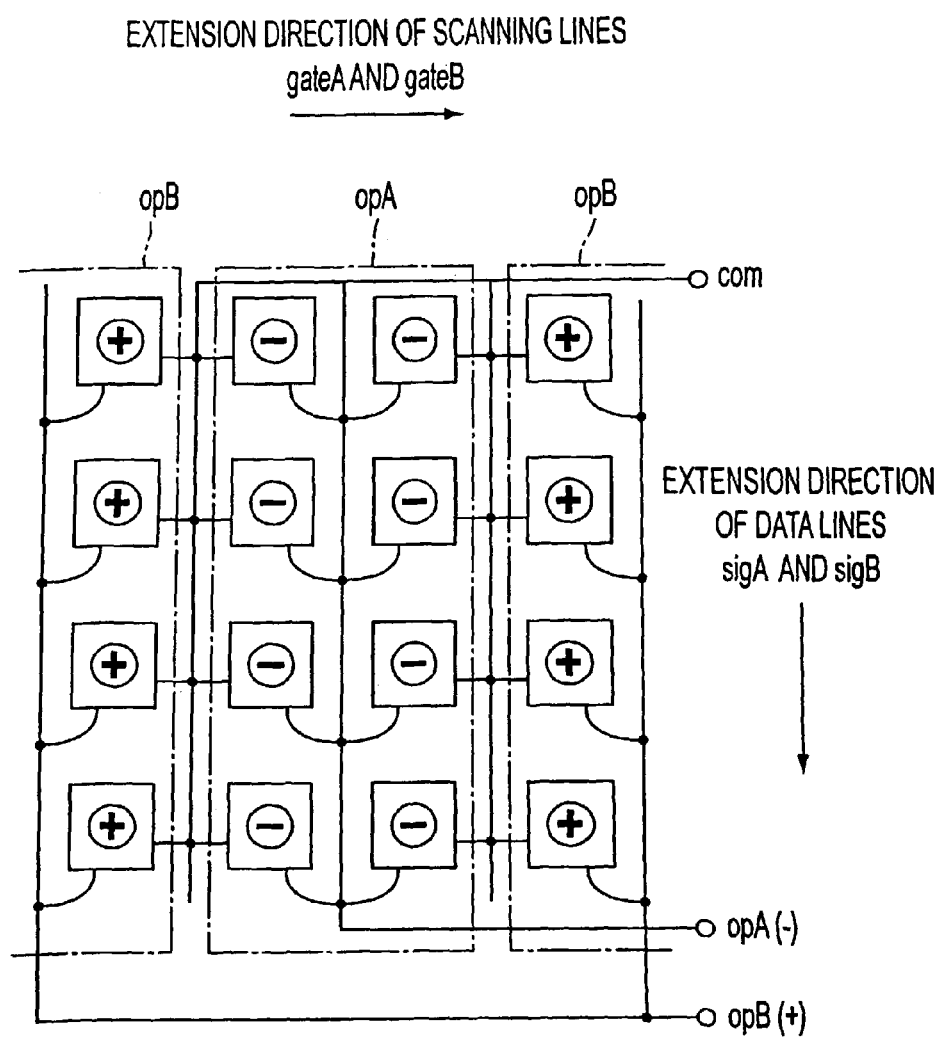
FIG. 18 is an illustration showing the arrangement of pixels in a display apparatus according to a third embodiment of the present invention.

From the viewpoint of the fact that pixels are arranged in such a way that driving current flows at an opposite polarity in a section between the pixels and the same common power-feed line "com", each pixel may be arranged as shown in FIG. 18. In this embodiment, since the construction of each of the pixels 7A and 7B is similar to that of the second embodiment. Therefore, the description has been omitted. In FIG. 18 and FIGS. 19 to 21, for describing each embodiment to be described below, a pixel corresponding to the pixel 7A described with reference to FIGS. 13; 14, and 16 is shown by the sign (−), and a pixel corresponding to the pixel 7B described with reference to FIGS. 13, 15, and 16 is shown by the sign (+)

As shown in FIG. 18, in this embodiment, the construction is formed in such a way that the polarity of the driving current in each of the pixels 7A and 7B is the same along the extension direction of the data lines "sigA" and "sigB" and that along the extension direction of the scanning lines "gateA" and "gateB", the polarity of the driving current in each of the pixels 7A and 7B is inverted every two pixels.

Also when the construction is formed in this manner, driving current i in a direction indicated by arrows E and F in FIG. 13 flows between each of the pixels 7A and 7B and the common power-feed line "com", respectively. For this reason, since the current which flows through the common power-feed line "com" is cancelled by the driving current i of a different polarity, a smaller amount of the driving current flowing through the common power-feed lines "com" is required. Therefore, since the common power-feed lines "com" can be made correspondingly narrower, it is possible to increase the ratio of the light-emission area of the pixel area in the pixels 7A and 7B of the pixel area and to improve display performance, such as luminance, contrast ratio, and so on. In addition, in this embodiment, since the polarity of the driving current is inverted every two pixels along the extension direction of the scanning lines "gateA" and "gateB", for the pixels which are driven by driving current having the same polarity, the counter electrodes "opA" and "opB" which are common to the adjacent pixels for two rows may be formed in a stripe form. Therefore, the number of stripes of the counter electrodes "opA" and "opB" can be reduced by half. Further, since the resistance of the counter electrodes "opA" and "opB" can be decreased in comparison with the stripe for each pixel, an influence of a voltage drop of the counter electrodes "opA" and "opB" can be reduced.

Fourth Embodiment

Figure 19:
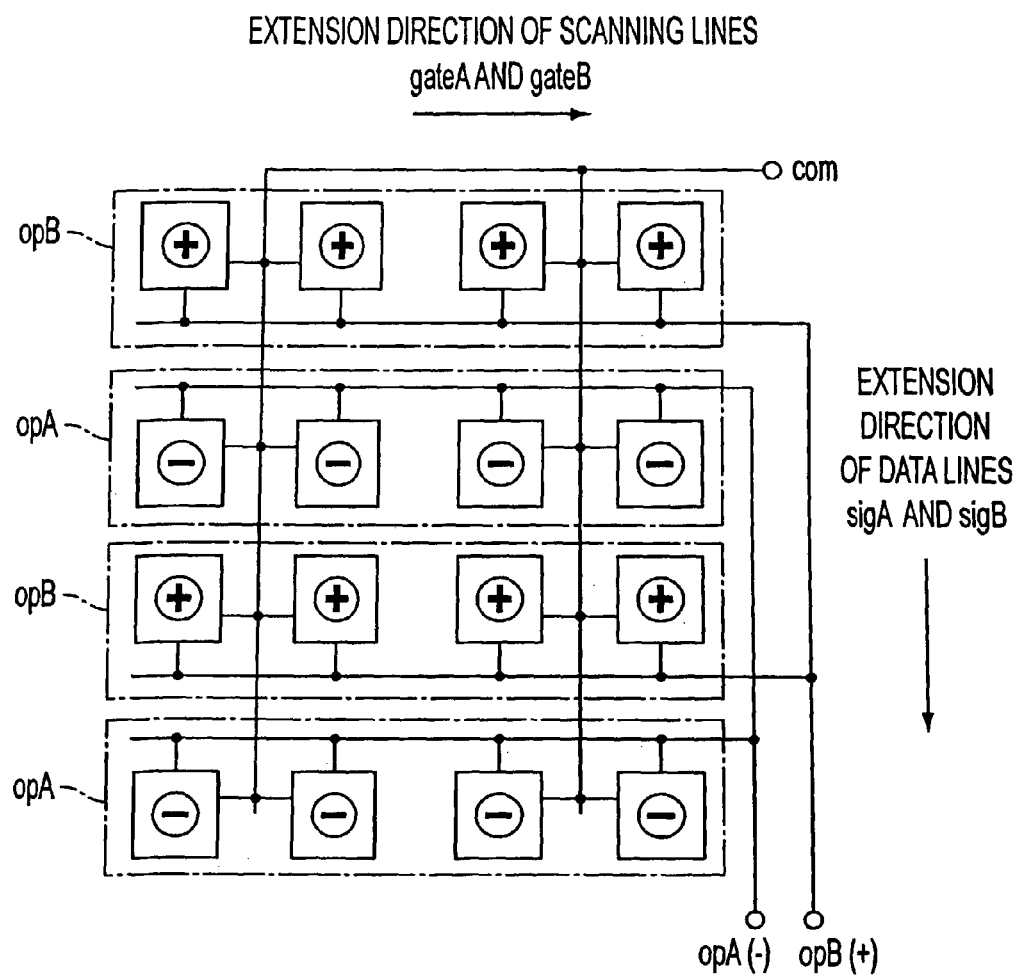
FIG. 19 is an illustration showing the arrangement of pixels in a display apparatus according to a fourth embodiment of the present invention.

Furthermore, from the viewpoint of the fact that pixels are arranged in such a way that driving current flows at an opposite polarity in a section between the pixels and the same common power-feed line "com", each pixel may be arranged as shown in FIG. 19.

As shown in FIG. 19, in this embodiment, the construction is formed in such a way that the polarity of the driving current in each of the pixels 7A and 7B is the same along the extension direction of the scanning lines "gateA" and "gateB" and that along the extension direction of the data lines "sigA" and "sigB", the polarity of the driving current in each of the pixels 7A and 7B is inverted for each pixel.

Also in the case where the construction is formed in this manner, similarly to the second embodiment or the third embodiment, since the current flowing through the common power-feed lines "com" is cancelled by the driving current having a different polarity, a smaller amount of the driving current flowing through the common power-feed lines "com" is required. Therefore, since the common power-feed lines "com" can be made correspondingly narrower, it is possible to increase the ratio of the light-emission area of the pixel area in the pixels 7A and 7B and to improve display performance, such as luminance, contrast ratio, and so on.

Fifth Embodiment

Figure 20:
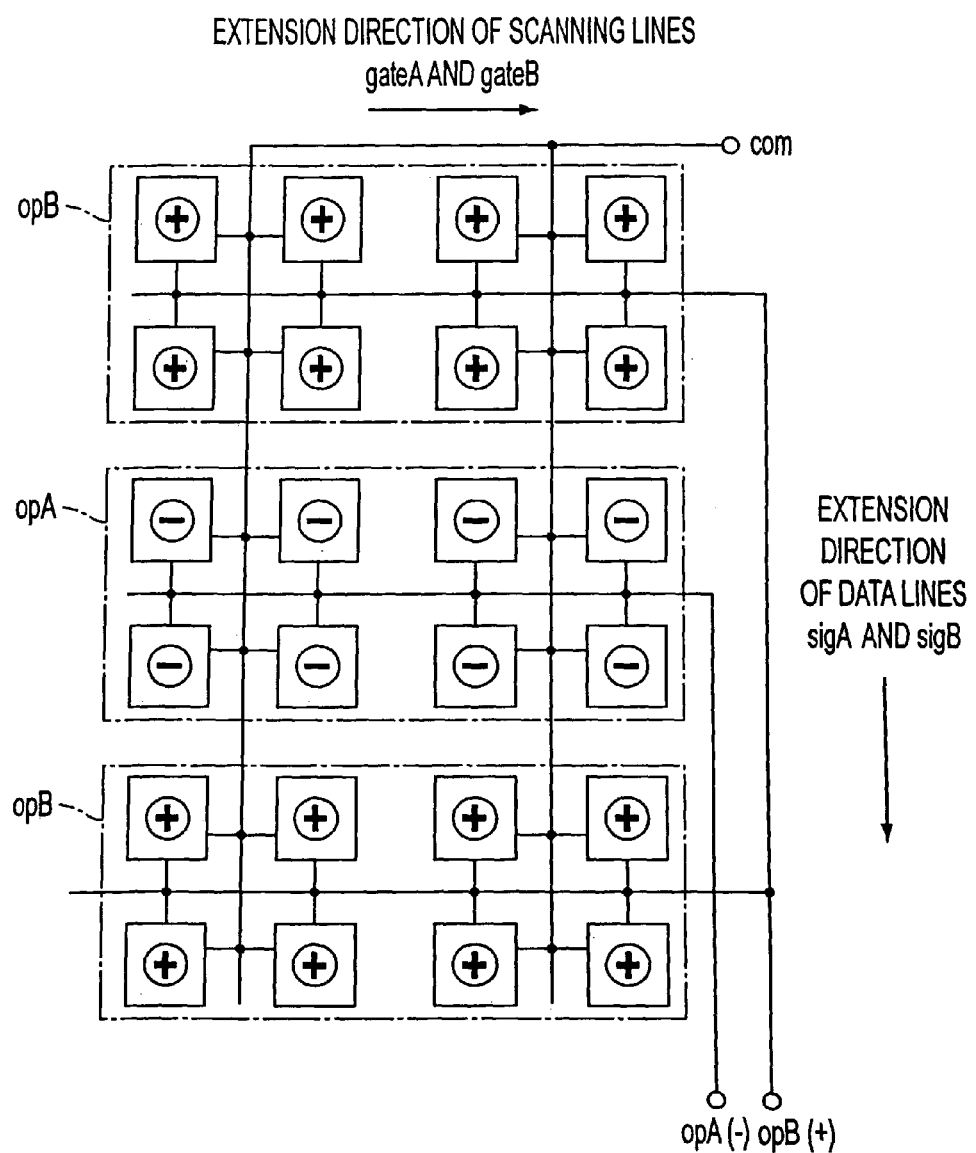
FIG. 20 is an illustration showing the arrangement of pixels in a display apparatus according to a fifth embodiment of the present invention.

Furthermore, from the viewpoint of the fact that pixels are arranged in such a way that driving current flows at an opposite polarity in a section between the pixels and the same common power-feed line "com", each pixel may be arranged as shown in FIG. 20.

As shown in FIG. 20, in this embodiment, the construction is formed in such a way that the polarity of the driving current in each of the pixels 7A and 7B is the same along the extension direction of the scanning lines "gateA" and "gateB" and that along the extension direction of the data lines "sigA" and "sigB", the polarity of the driving current in each of the pixels 7A and 7B is inverted every two pixels.

When the construction is formed in this manner, similarly to the third embodiment, since the current which flows through the common power-feed line "com" is cancelled by the driving current of a different polarity, a smaller amount of the driving current flowing through the common power-feed lines "com" is required. Therefore, since the common power-feed lines "com" can be made correspondingly narrower, it is possible to increase the ratio of the light-emission area of the pixel area in the pixels 7A and 7B and to improve display performance, such as luminance, contrast ratio, and so on. In addition, in this embodiment, since the polarity of the driving current is inverted every two pixels along the extension direction of the data lines "sigA" and "sigB", for the pixels which are driven by the driving current having the same polarity, the counter electrodes "opA" and "opB" which are common to the adjacent pixels for two rows may be formed in a stripe form. Therefore, the number of stripes of the counter electrodes "opA" and "opB" can be reduced by half. Further, since the resistance of the counter electrodes "opA" and "opB" can be decreased in comparison with the stripe for each pixel, an influence of a voltage drop of the counter electrodes "opA" and "opB" can be reduced.

Sixth Embodiment

Figure 21:
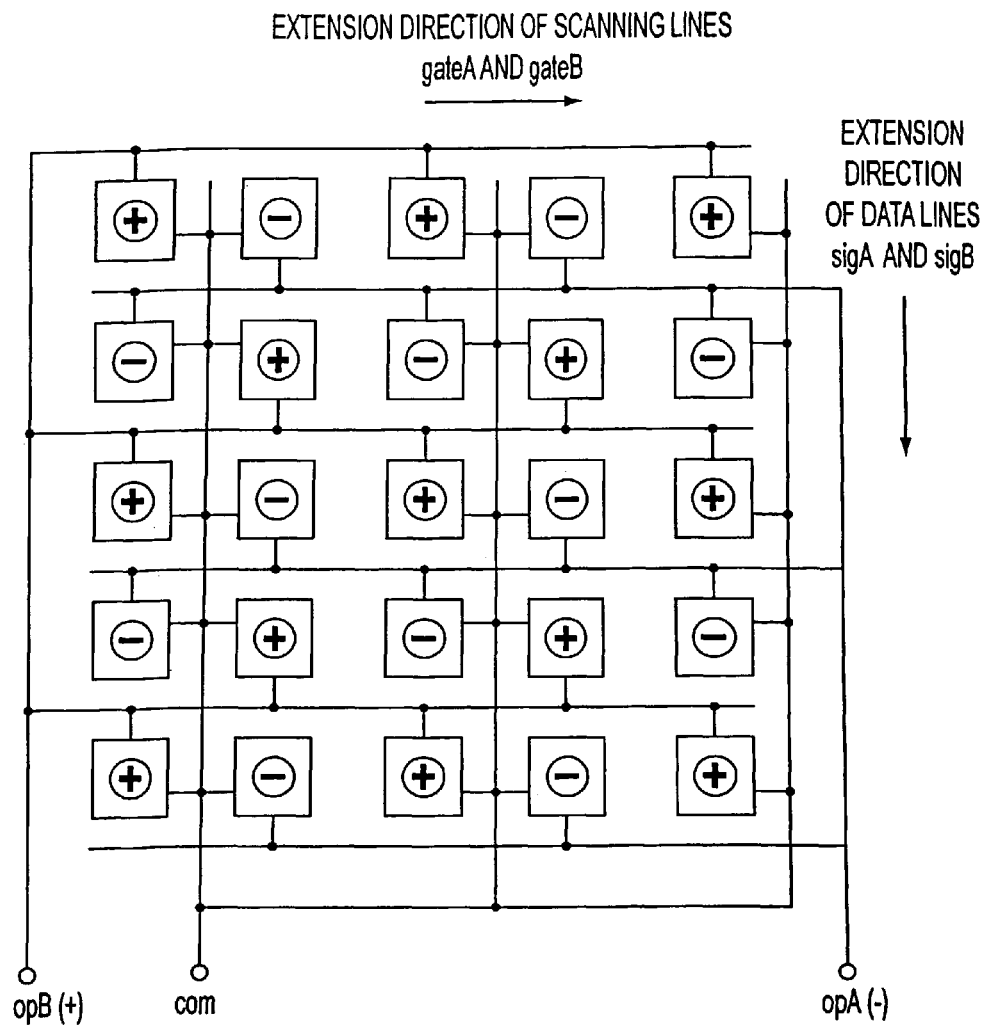
FIG. 21 is an illustration showing the arrangement of pixels in a display apparatus according to a sixth embodiment of the present invention.
Figure 22:
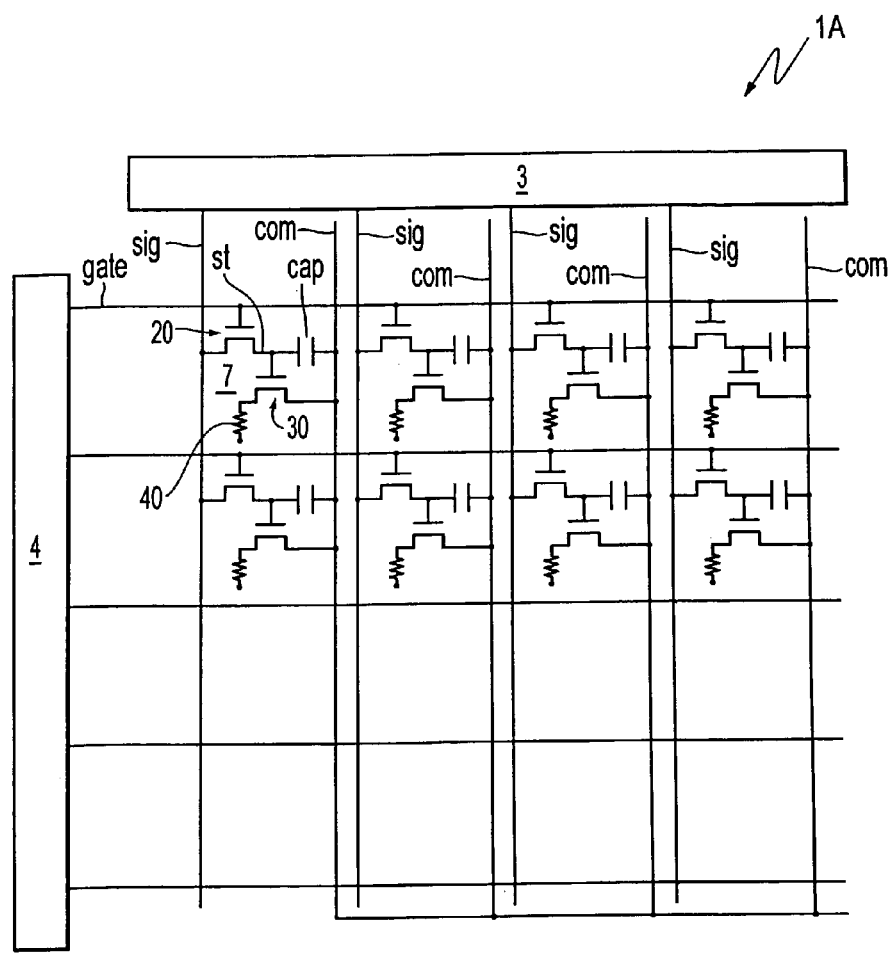
FIG. 22 is a block diagram of a conventional display apparatus.
Figure 23:
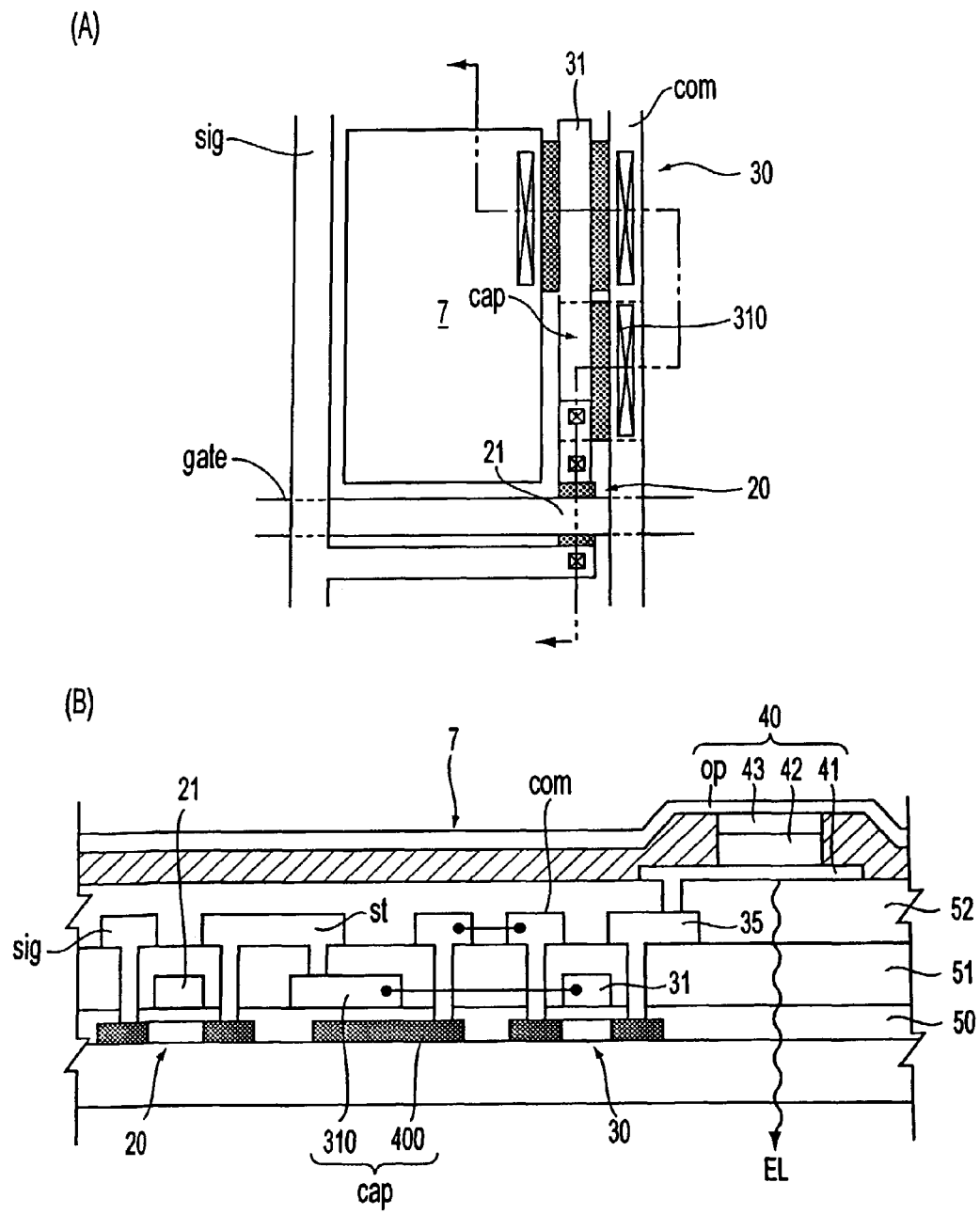
FIG. 23(A) is a plan view in which a pixel formed in the display apparatus shown in FIG. 22 is enlarged.
FIG. 23(B) is a sectional view thereof.

Furthermore, from the viewpoint of the fact that pixels are arranged in such a way that driving current flows at an opposite polarity in a section between the pixels and the same common power-feed line "com", each pixel may be arranged as shown in FIG. 21.

As shown in FIG. 21., in this embodiment, the construction is formed in such a way that the polarity of the driving current in each of the pixels 7A and 7B is inverted for each pixel along both the extension direction of the scanning lines "gateA" and "gateB" and the extension direction of the data lines "sigA" and "sigB".

Also in the case where the construction is formed in this manner, similarly to the second to fourth embodiments, since the current flowing through the common power-feed lines "com" is cancelled by the driving current having a different polarity, a smaller amount of the driving current flowing through the common power-feed lines "com" is required. Therefore, since the common power-feed lines "com" can be made correspondingly narrower, it is possible to increase the ratio of the light-emission area in the pixels 7A and 7B and to improve display performance, such as luminance, contrast ratio, and so on.

When the pixels 7A and 7B are arranged in this manner, the counter electrodes "opA" and "opB" in a stripe form cannot cope. Nevertheless, the construction may be formed in such a way that the counter electrodes "opA" and "opB" are formed for each of the pixels 7A and 7B, respectively, and that the counter electrodes "opA" and "opB" are connected by a wiring layer.

INDUSTRIAL APPLICABILITY

As has been described up to this point, in the display apparatus according to the present invention, since pixels to which driving current is passed in a section between the pixels and the common power-feed line are arranged on both sides of the common power-feed line, only one common power-feed line is required for pixels for two rows. Therefore, since the formation area of the common power-feed lines "com" can be made narrower in comparison with a case where the common power-feed line is formed for each group of pixels for one row, it is possible to increase correspondingly the ratio of the light-emission area in the pixels and to improve display performance, such as luminance, contrast ratio, and so on.

When two types of pixels in which the light-emission element are driven by a driving current whose polarity is inverted are among a plurality of pixels to which the driving current is passed in a section between the pixels and the same common power-feed line, in one common power-feed line, since driving current flowing from the common power-feed line to the light-emission element cancels the driving current flowing in an opposite direction from the light-emission element to the common power-feed line, a smaller amount of the driving current which flows through the common power-feed line is required. Therefore, since the common power-feed lines "com" can be made correspondingly narrower, it is possible to increase the ratio of the light-emission area in the pixels and to improve display performance, such as luminance, contrast ratio, and so on.

The invention claimed is:

1. A display apparatus comprising:
a substrate;
a plurality of scanning lines;
a plurality of data lines;
a plurality of power-feed lines;
a plurality of pixels formed in a display section, the plurality of pixels corresponding to intersections of the plurality of scanning lines and the plurality of data lines, one of the pixels of the plurality of pixels comprising a first transistor, a second transistor and a light-emission element having a pixel electrode, the second transistor controlling electrical connection between the pixel electrode and one power-feed line of the plurality of power feed lines;
a counter electrode that opposes the pixel electrode of the one of the pixels;
a gate electrode of the second transistor being set in accordance with an image signal supplied through a corresponding one of the plurality of data lines and the first transistor;
a continuous silicon film of the second transistor formed above and independent of the substrate, the continuous silicon film being at least one of source region and a drain region of the second transistor;
a gate electrode of the first transistor being supplied with a scanning signal through a corresponding one of the plurality of scanning lines;
the light-emission element light when a current flows through the counter electrode, the pixel electrode, the second transistor and one power-feed line of the plurality of power-feed lines,
a line width of a portion of the one power-feed line being set to be wider than that of a portion of the one data line, and
the portion of the one power-feed line and the portion of the one data line being in the display section; and
the second transistor and a second transistor of another pixel being disposed on opposite sides of the one power-feed line and sharing the continuous silicon film
the one power-feed line being sandwiched between the one pixel of the plurality of pixels and the another pixel of the plurality of pixels;
a polarity of driving current driving the light emission element of the one pixel being opposite to a polarity of a driving current driving a light emission element of the another pixel.

2. A display apparatus comprising:
a substrate;
a plurality of scanning lines;
a plurality of data lines;
a plurality of power-feed lines;
a plurality of pixels formed in a display section, the plurality of pixels corresponding to intersections of the plurality of scanning lines and the plurality of data lines, one of the pixels of the plurality of pixels comprising a first transistor, a second transistor and a light-emission element having a pixel electrode, the second transistor controlling electrical connection between the pixel electrode and one power-feed line of the plurality of power feed lines;
a counter electrode that opposes the pixel electrode of the one of the pixels;
a gate electrode of the second transistor being set in accordance with an image signal supplied through a corresponding one of the plurality of data lines and the first transistor;
a continuous silicon film of the second transistor formed above and independent of the substrate, the continuous silicon film being at least one of source region and a drain region of the second transistor;
a gate electrode of the first transistor being supplied with a scanning signal through a corresponding one of the plurality of scanning lines;
the light-emission element light when a current flows through the counter electrode, the pixel electrode, the second transistor and one power-feed line of the plurality of power-feed lines,
a line width of a portion of the one power-feed line being set to be wider than that of a portion of the one data line, and
the portion of the one power-feed line and the portion of the one data line being in the display section; and
the second transistor and a second transistor of another pixel being disposed on opposite sides of the one power-feed line and sharing the continuous silicon film the one power-feed line being sandwiched between the one pixel of the plurality of pixels and the another pixel of the plurality of pixels;

the plurality of pixels including a set of pixels having light-emission elements disposed along one of the plurality of scanning lines, a polarity of a driving current driving a light emission element of a predetermined pixel of the set of pixels being opposite to a polarity of a driving current driving a light emission element of a pixel adjacent to the predetermined pixel of the set of pixels.

3. A display apparatus comprising:
a substrate;
a plurality of scanning lines;
a plurality of data lines;
a plurality of power-feed lines;
a plurality of pixels formed in a display section, the plurality of pixels corresponding to intersections of the plurality of scanning lines and the plurality of data lines, one of the pixels of the plurality of pixels comprising a first transistor, a second transistor and a light-emission element having a pixel electrode, the second transistor controlling electrical connection between the pixel electrode and one power-feed line of the plurality of power feed lines;
a counter electrode that opposes the pixel electrode of the one of the pixels;
a gate electrode of the second transistor being set in accordance with an image signal supplied through a corresponding one of the plurality of data lines and the first transistor;
a continuous silicon film of the second transistor formed above and independent of the substrate, the continuous silicon film being at least one of source region and a drain region of the second transistor;
a gate electrode of the first transistor being supplied with a scanning signal through a corresponding one of the plurality of scanning lines;
the light-emission element light when a current flows through the counter electrode, the pixel electrode, the second transistor and one power-feed line of the plurality of power-feed lines,
a line width of a portion of the one power-feed line being set to be wider than that of a portion of the one data line, and
the portion of the one power-feed line and the portion of the one data line being in the display section; and
the second transistor and a second transistor of another pixel being disposed on opposite sides of the one power-feed line and sharing the continuous silicon film
the one power-feed line being sandwiched between the one pixel of the plurality of pixels and the another pixel of the plurality of pixels;
the plurality of pixels including a set of pixels having light emission elements disposed along one of the plurality of data lines, a polarity of a driving current driving a light emission element of a predetermined pixel of the set of pixels being opposite to a polarity of a driving current driving a light emission element of a pixel adjacent to the predetermined pixel of the set of pixels.

4. A display apparatus comprising:
a substrate;
a plurality of scanning lines;
a plurality of data lines;
a plurality of power-feed lines;
a plurality of pixels formed in a display section, the plurality of pixels corresponding to intersections of the plurality of scanning lines and the plurality of data lines, one of the pixels of the plurality of pixels comprising a first transistor, a second transistor and a light-emission element having a pixel electrode, the second transistor controlling electrical connection between the pixel electrode and one power-feed line of the plurality of power feed lines;
a counter electrode that opposes the pixel electrode of the one of the pixels;
a gate electrode of the second transistor being set in accordance with an image signal supplied through a corresponding one of the plurality of data lines and the first transistor;
a continuous silicon film of the second transistor formed above and independent of the substrate, the continuous silicon film being at least one of source region and a drain region of the second transistor;
a gate electrode of the first transistor being supplied with a scanning signal through a corresponding one of the plurality of scanning lines;
the light-emission element light when a current flows through the counter electrode, the pixel electrode, the second transistor and one power-feed line of the plurality of power-feed lines,
a line width of a portion of the one power-feed line being set to be wider than that of a portion of the one data line, and
the portion of the one power-feed line and the portion of the one data line being in the display section; and
the second transistor and a second transistor of another pixel being disposed on opposite sides of the one power-feed line and sharing the continuous silicon film
the one power-feed line being sandwiched between the one pixel of the plurality of pixels and the another pixel of the plurality of pixels;
a polarity of a driving current driving a light emission element of a predetermined pixel of a set of pixels of the plurality of pixels being opposite to a polarity of a driving current driving light emission elements of all pixels adjacent to the predetermined pixel set of pixels.

5. A display apparatus comprising:
a substrate;
a plurality of scanning lines;
a plurality of data lines;
a plurality of power-feed lines;
a plurality of pixels formed in a display section, the plurality of pixels corresponding to intersections of the plurality of scanning lines and the plurality of data lines, one of the pixels of the plurality of pixels comprising a first transistor, a second transistor and a light-emission element having a pixel electrode, the second transistor controlling electrical connection between the pixel electrode and one power-feed line of the plurality of power feed lines;
a counter electrode that opposes the pixel electrode of the one of the pixels;
a gate electrode of the second transistor being set in accordance with an image signal supplied through a corresponding one of the plurality of data lines and the first transistor;
a continuous silicon film of the second transistor formed above and independent of the substrate, the continuous silicon film being at least one of source region and a drain region of the second transistor;
a gate electrode of the first transistor being supplied with a scanning signal through a corresponding one of the plurality of scanning lines;

the light-emission element light when a current flows through the counter electrode, the pixel electrode, the second transistor and one power-feed line of the plurality of power-feed lines,
a line width of a portion of the one power-feed line being set to be wider than that of a portion of the one data line, and
the portion of the one power-feed line and the portion of the one data line being in the display section; and
the second transistor and a second transistor of another pixel being disposed on opposite sides of the one power-feed line and sharing the continuous silicon film;
the continuous silicon film being one of the source region or the drain region of the second transistor, and being the other of the source region or the drain region for the second transistor of the another pixel.

6. A display apparatus comprising:
a substrate:
a plurality of scanning lines;
a plurality of data lines;
a plurality of power-feed lines;
a plurality of pixels corresponding to intersections of the plurality of scanning lines and the plurality of data lines, one pixel of the plurality of pixels comprising a first transistor, a second transistor and light-emission element having a pixel electrode, the second transistor controlling electrical connection between the pixel electrode and a corresponding one of the plurality of power-feed lines;
a counter electrode that opposes the pixel electrode of the one pixel;
a gate electrode of the second transistor being set in accordance with an image signal supplied through one data line of the plurality of data lines and the first transistor; a continuous silicon film of the second transistor formed on and independent of the substrate, the continuous silicon film being at least one of a source region and a drain region of the second transistor; a gate electrode of the first transistor being supplied with a scanning signal through a corresponding one of the plurality of scanning lines;
the light-emission element emitting light when a current flows through a current path formed of the counter electrode the pixel electrode and the one power-feed line of the plurality of power-feed lines,
the resistance value per unit length of the one power-feed line being set to be smaller than that of the one data line; and the second transistor and a second transistor of another pixel being disposed on opposite sides of the one power-feed line and sharing the continuous silicon film, which is at least one of a source region and a drain region for the second transistor of the another pixel, the one power-feed line being electrically connected to the continuous silicon film;
the continuous silicon film being one of the source region or the drain region of the second transistor, and being the other of the source region or the drain region for the second transistor of the another pixel.

7. A display apparatus comprising:
a substrate;
a plurality of scanning lines;
a plurality of data lines that extend in a direction that intersects the scanning lines;
a plurality of power-feed lines;
a plurality of pixels in a matrix pattern, the plurality of pixels corresponding to intersections of the plurality of scanning lines and the plurality of data lines, one pixel of the plurality of pixels including:
a pixel electrode;
a first transistor including a gate electrode, the gate electrode being supplied with a scanning signal through a corresponding one of the plurality of scanning lines;
a second transistor that, in accordance with an image signal supplied through a corresponding one of the plurality of data lines and the first transistor, controls electrical connection between the pixel electrode and a corresponding one of the plurality of power-feed lines;
a continuous silicon film of the second transistor formed on and independent of the substrate, the continuous silicon film being at least one of a source region and a drain region of the second transistor; and
a light emission element that, when the corresponding one of the power-feed lines and the pixel electrode are electrically connected to each other by the second transistor, emits light by a drive current that flows between the pixel electrode and a counter electrode disposed opposite to the pixel electrode,
the plurality of pixels including a first row of pixels and a second row of pixels disposed following opposite sides of one of the power-feed lines,
the one of the power-feed lines supplying drive current to the first row of pixels and the second row of pixels,
the second transistor and a second transistor of another pixel being disposed on opposite sides of the one of the power-feed lines and sharing the continuous silicon film, which is at least one of a source region and a drain region of the second transistor of the another pixel, the one of the power-feed lines being electrically connected to the continuous silicon film,
a first set of two of the plurality of data lines being disposed at the opposite side of the first row of pixels than the one of the power-feed lines; and
a second set of two of the plurality of data lines being disposed at the opposite side of the second row of pixels than the one of the power-feed lines;
the continuous silicon film being one of the source region or the drain region of the second transistor, and being the other of the source region or the drain region for the second transistor of the another pixel.

8. A display apparatus comprising:
a substrate;
a scanning line;
a pair of pixels, each of the pixels including:
a first transistor electrically coupled to the scanning line;
a second transistor electrically coupled to the first transistor; and
a light-emission element electrically coupled to the second transistor;
a power-feed line that supplies the pair of pixels with a drive current through the second transistors; and
an island-shaped semiconductor film continuously formed on and independent of the substrate, the island-shaped semiconductor film being formed across and being electrically connected to the power-feed line, the island-shaped semiconductor film being used as at least one of a source region and a drain region for each of the second transistors of the pair of pixels;
the island-shaped semiconductor film being used as one of the source or the drain for the second transistor of a first pixel of the pair of pixels, and being used as the other of the source or the drain for the second transistor of a second pixel of the pair of pixels.

9. A display apparatus comprising:
- a substrate:
- a first transistor;
- a first light-emission element electrically coupled to the first transistor;
- a second transistor;
- a second light-emission element electrically coupled to the second transistor;
- a power-feed line that supplies the first light-emission element with a first drive current through the first transistor and that supplies the second light-emission element with a second drive current through the second transistor; and
- an island-shaped semiconductor film continuously formed on and independent of the substrate, the island-shaped semiconductor film being formed across, and electrically connected to, the power-feed line, the island-shaped semiconductor film being used as at least one of a source region and a drain region for each of the first transistor and the second transistor;
- the island-shaped semiconductor film being used as one of the source or the drain for the first transistor, and being used as the other of the source or the drain for the second transistor.

* * * * *